United States Patent
Turner et al.

(10) Patent No.: US 6,497,141 B1
(45) Date of Patent: Dec. 24, 2002

(54) PARAMETRIC RESONANCE IN MICROELECTROMECHANICAL STRUCTURES

(75) Inventors: Kimberly L. Turner, Goleta, CA (US); Noel C. MacDonald, Santa Barbara, CA (US)

(73) Assignee: Cornell Research Foundation Inc., Ithaca, NY (US)

(*) Notice: Subject to any disclaimer, the term of this patent is extended or adjusted under 35 U.S.C. 154(b) by 45 days.

(21) Appl. No.: 09/586,976

(22) Filed: Jun. 5, 2000

Related U.S. Application Data

(60) Provisional application No. 60/138,125, filed on Jun. 7, 1999.

(51) Int. Cl.[7] .......................... G01B 7/34; G01N 13/10
(52) U.S. Cl. ........................................ 73/105; 310/309
(58) Field of Search ................. 73/105; 310/309; 361/283.1, 283.3, 281

(56) References Cited

U.S. PATENT DOCUMENTS

| | | | |
|---|---|---|---|
| 4,472,239 A | 9/1984 | Johnson | |
| 4,918,032 A | 4/1990 | Jain | |
| 5,198,390 A | 3/1993 | MacDonald | |
| 5,211,051 A | 5/1993 | Kaiser | |
| 5,393,375 A | 2/1995 | MacDonald | |
| 5,719,073 A | 2/1998 | Shaw | |
| 5,914,553 A | 6/1999 | Adams | 310/309 |
| 6,000,280 A | 12/1999 | Miller | 73/105 |
| 6,051,866 A | 4/2000 | Shaw | |
| 6,073,484 A | 6/2000 | Miller | 73/105 |

FOREIGN PATENT DOCUMENTS

| | | |
|---|---|---|
| EP | 0 480 471 A2 | 4/1992 |
| EP | 0 567 938 A1 | 11/1993 |
| EP | 0 665 590 A2 | 8/1995 |
| EP | 0 703 429 A2 | 3/1996 |
| GB | 2101336 * | 1/1983 ................ 73/105 |
| WO | 03740 | 3/1992 |

OTHER PUBLICATIONS

Tang, W.C. et al., "Electrostatic Comb Drive Levitation and Control Method", Journal of Microelectromechanical Systems, vol. 1, No. 4, Dec. 1992, pp. 170–178.*

(List continued on next page.)

Primary Examiner—Daniel S. Larkin
(74) Attorney, Agent, or Firm—Jones, Tullar & Cooper, P.C.

(57) ABSTRACT

MEM structures which may be driven at parametric frequencies to provide stable operation and to permit precise switching between stable and unstable operations by very small changes in the drive frequency or by very small changes in the characteristics of the structure itself so as to provide improved control and sensing are disclosed. The techniques of the present invention are applicable to a wide variety of microstructures, including parallel plate linear actuators, reduction and augmentation actuators, linear force comb actuators, and in particular to torsional scanning probe z-actuators having an integrated tip. These devices incorporate capacitive actuators, or drivers, for producing mechanical motion, and more particularly comb-type actuator structures which consist of high aspect ratio MEM beams fabricated as interleaved fixed and movable capacitor fingers. The capacitive actuator structures can be used either for sensing displacements or inducing motion, the capacitive plates of the fixed and movable fingers allowing a wide range of motion and high amplitudes without failure. Such micromechanical torsional resonators obey the Mathieu equation, and are driven by a suitable driving force such as an AC driver to resonate at frequencies other than their natural frequencies of resonance with a sharp transition between stable and unstable operation. The devices may be switched between stable and unstable operation by very small changes in the physical characteristics, or parameters, of the devices and/or by small changes in the frequency or amplitude of the driving force.

34 Claims, 17 Drawing Sheets

OTHER PUBLICATIONS

Xu, Y. et al., "Integrated Micro–Scanning Tunneling Microscope", Appl. Phys. Lett., vol. 67, No. 16, Oct. 16, 1995, pp. 2305–2307.*

Xu, Y. et al., "Microelectromechanical Scanning Tunneling Microscope", Transducers '95–Eurosensors IX, the 8th International Conference on Solid–State Sensors and Acutators, and Eurosensors IX, Jun. 25–Jun. 29, 1995, pp. 640–643.*

Grigg, D.A., Russell, P.E.& Griffith, J.E.; Rocking–beam force–balance approach to atomic force microscopy; *Ultramicroscopy 42–44*, (1992); Amsterdam, NL; pp. 1504–1508.

Miller, Scott A.; Turner, Kimberly L.; MacDonald,Noel C.; Microelectromechanical scanning probe instruments for array architectures; *Rev. Sci. Instrum. 68(11)*, Nov. 1997, pp. 4155–4162.

* cited by examiner

PARAMETRIC RESONANCE IN MICROELECTROMECHANICAL STRUCTURES

This application claims the benefit of U.S. Provisional Application No. 60/138,125, filed Jun. 7, 1999, the disclosure of which is hereby incorporated herein by reference.

This invention was made with government support under Grant DABT63-95-C-0121, awarded by DARPA, and under Grant No. 96-16048, awarded by the National Science Foundation. The government has certain rights in the invention.

BACKGROUND OF THE INVENTION

The present invention relates, in general, to microelectromechanical (MEM) structures, and particularly to sensors, filters, switches and the like which utilize variable capacitors for driving and for measuring displacement, as well as to circuitry for measuring output signals produced by such capacitors and for producing drive signals at frequencies selected to produce parametric resonances having sharp transitions between stable and unstable motion of MEM structures.

The generic term "microelectromechanical system" (or MEMS) has been applied to the broad field of micromachining and refers to structures such microsensors, microactuators, microinstruments, microoptics, and microfluidics. The applications of these devices are wide-ranging and include accelerometers, which may be used, for example, to deploy automobile airbags, inkjet printer heads and other fluidic devices, arrays of movable mirrors for color projection displays, atomic probes for imaging and transporting atoms, and the like. MEMS devices typically use silicon as a structural material, with the devices being fabricated using integrated circuit technology and more particularly using the single crystal reactive etch and metalization (SCREAM) process which is described, for example, in U.S. Pat. No. 5,719,073, issued Feb. 17, 1998, the disclosure of which is hereby incorporated herein by reference.

Although the use of MEM systems is becoming widely accepted, these micrometer-scale devices present challenges in the real time measurement of device motion, for such devices exhibit multiple modes of motion, have nonlinearities in their spring constants and damping, and exhibit other deviations from the simple models which are often used to describe the motion of mechanical structures. Precise real-time measurements of these devices are needed to understand, to model, and to control these effects. The measurement of device motion and parameters at the nanometer-scale has been done using microinstrumentation fabricated on the same chip as the test devices through the use of variable capacitor motion sensors. However, the use of variable capacitors to measure motion assumes the capacitor structure is stable throughout the measurement; that is, that the gap remains constant and the capacitor electrodes do not rotate or move in a direction perpendicular to the direction of the desired motion to be measured.

One reason for the difficulty in measurements is that in many resonant microelectromechanical systems with electrostatic actuation, the application of a voltage to the device for driving it or for measuring changes in capacitance, changes the effective stiffness of the system. In certain systems, the application of a periodic voltage causes the stiffness to be changed periodically. The equation of motion for such a system is the Mathieu equation:

$$\frac{d^2\theta}{d\tau^2} + (\beta + 2\delta\cos 2\tau)\theta = 0$$

Mathieu equation has been studied extensively in many physical contexts because it governs the pumping of a swing, the stability of ships and columns, Faraday crispations in surface waves on water, electrons in Penning traps, and parametric amplifiers based on electronic or superconducting devices. Many theoretical studies have been carried out on the Mathieu equation, but most of them have been macroscopic, and in these cases damping limits the obtainable experimental results.

SUMMARY OF THE INVENTION

The present invention is directed to MEM structures which may be parametrically driven to provide stable operation and to permit precise switching between stable and unstable operations by very small changes in the drive frequency or by very small changes in the characteristics of the structure itself so as to provide improved control and sensing. Although the techniques of the present invention are applicable to a wide variety of microstructures, including parallel plate linear actuators, reduction and augmentation actuators, and linear force comb actuators, the invention will be described herein in terms of torsional devices, and in particular to torsional scanning probe z-actuators having an integrated tip, such as the device described in the above-mentioned U.S. Pat, No. 6,000,280. This device is a micromechanical torsional resonator which incorporates capacitive actuators, or drivers, for producing mechanical motion, and more particularly is a structure which incorporates an improved comb-type actuator structure which consists of high aspect ratio MEM beams fabricated as interleaved fixed and movable capacitor fingers. The device is fabricated from single-crystal silicon and includes a cantilevered beam connected to an adjacent substrate by a torsion bar, within an atomically sharp tip formed on the beam. The capacitive actuator structure can be used either for sensing displacements or inducing motion, the capacitive plates of the fixed and movable fingers allowing a wide range of motion and high amplitudes without failure. This type of actuator generates out of plane motion forces between the fixed and movable fingers due to a phenomenon known as comb-drive levitation, wherein a voltage is applied to the fixed electrodes on the silicon substrate, while the substrate and the adjacent movable electrodes are grounded. This causes asymmetrical fringing electric fields between the movable and fixed electrodes which induce motion in the movable electrodes. Such a micromechanical torsional resonator obeys the Mathieu equation:

$$(\theta''+a\theta'+(\beta+2\delta \cos 2\tau)\theta=0$$

where $$a=c/2\omega I$$

$$\beta=(k+\gamma A_{DC})/4\omega^2 I$$

and $$\delta=(\gamma A_{AC})/4\omega^2 I$$

where I is the mass moment of inertia of the torsional cantilever, c is the torsional damping constant, k is torsional stiffness, and M is the applied torque, γ is a parameter that corresponds to the drive strength, ω is the driving frequency, and A is the input strength under normal operation.

It has been found that such a MEM resonator exhibits unique stability properties, wherein multiple regions in the β-δ parameter space have unstable solutions so that the resonator exhibits resonance-like behavior under several different conditions. The boundaries between these conditions of instability and regions where stable behavior is exhibited are extremely sharp so that a very small change in the frequency of a drive signal and, the characteristics of the MEM device, or a change in a parameter being measured can switch the vibrational motion of the MEM device from a stable to an unstable condition, or vice versa. It has been found that a to frequency change of as little as 0.001 Hz at 114 kHz in the drive signal can effect this change.

When operating in an instability region, the MEM devices of the invention provide increased sensitivity to changes in measured parameters, such as force measurements in an atomic force microscope (AFM). For example, in conventional atomic force microscopes, a high Q in the sensor device leads to higher sensitivity, but at the expense of bandwidth. By utilizing the parametric resonance instability of the present invention, the effect of Q can be decoupled from sensitivity. Further, since the device has such a high sensitivity to changes in frequency between its stable and unstable vibratory conditions, a small force; i.e., the force to be measured, applied to the MEM device can change its characteristics and cause it to "jump" across the boundary from an unstable to stable condition. Because the boundary is so sharp, very small force interactions can be measured. The forces being measured in such a device manifest themselves as changes in the torsional stiffness k of the device. Thus, a change in k will shift the position of the sharp boundary, changing the state of the resonator from "on" to "off", or vice versa. In addition, small changes in the voltage or frequency can be used independently to move the operating state from stable to unstable because of the dependence of the parameters β and δ on these values.

The shape of the instability regions can also be changed by changing the device design. For example, by changing the γ0 parameter, which is the applied force, the slope of the instability boundary changes, and this can be useful in trying to adjust operating characteristics such as the bandwidth of the stable region. Damping in the system also has an effect, for it "rounds" the bottom of the instability region and narrows its bandwidth. Thus, by changing the damping, which can be produced, for example, by changing the pressure in the environment of the system, the bandwidth or the lower boundary of the instability region is changed.

It has also been found that the Mathieu behavior of torsional resonators and other MEM devices can also be used to reduce parasitic signals in capacitive sensing. This is done by separating the drive and the sensing signals by parametrically exciting the MEM device at a frequency that is far from its natural resonant frequency. This is made possible in the present MEM systems since they are governed by Mathieu type equations, with the result that energy is transferred during parametric excitation in a unique manner. For example, if a given device with a natural frequency of $\omega_0$=57 kHz is driven at a frequency ω, where ω corresponds to the first Mathieu instability, where n=1 then ω will equal $2\omega_0/n$ which in this case is equal to 114 kHz. A parasitic signal which is included in the output from the MEM device will also be at a harmonic of the natural frequency; that is, $2\omega_0$, which is at 114 kHz in this case. However, the MEM device, when driven at the parametric frequency of 114 kHz will still vibrate torsionally at its natural frequency of 57 kHz, so the capacitive sensing signals of interest will be at 57 kHz. With this separation in frequency, it is straightforward to filter out the parasitic 114 kHz signal, thereby revealing the desired 57 kHz sensing signal.

Parametric resonance also holds promise as a mass sensor, for example in biochemical and medical fields for sensing such things as chemical reactions which result in mass changes. Because of the sharp transition from stability to instability, which depends on device parameters, a resonator provides an extremely sensitive way to measure such things as small changes in the mass of a device. A parametric mass sensor may be, for example, an in-plane, parallel plate capacitive actuator, although various actuator configurations may be used.

In summary, the present invention is directed to a parametric resonance oscillator which comprises a microelectromechanical structure mounted for motion with respect to a substrate, wherein the structure has a natural resonant frequency of oscillation. The structure includes a motion sensor which, in the preferred embodiment, includes capacitive plates on the moving structure and adjacent stationary structure. A drive circuit supplies a drive signal to the electrodes at a frequency which is selected to produce parametric oscillation of the MEM structure. This n=1 parametrically resonant frequency is greater than the natural resonant frequency of the structure and provides a sharp boundary between stable and unstable operation, permitting a switching between these two conditions to improve the sensitivity of measurements made by the structure, and improving the accuracy of capacitive measurements through the elimination of parasitic frequencies.

BRIEF DESCRIPTION OF DRAWINGS

The foregoing and additional objects, features, and advantages of the present invention will become apparent to those of skill in the art from a consideration of the following detailed description of preferred embodiments, taken in conjunction with the accompanying drawings, in which.

DESCRIPTION OF PREFERRED EMBODIMENTS

Figure 1:
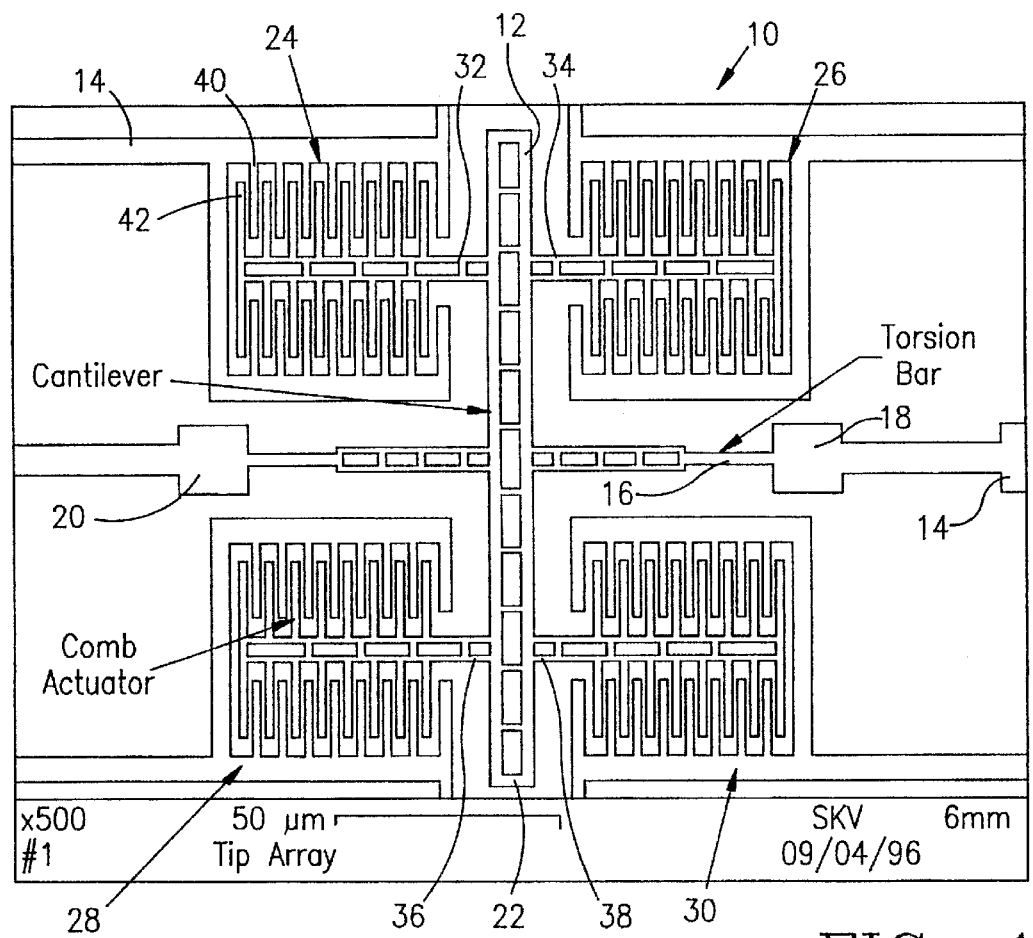
FIG. 1 is a scanning electron microscope image of a torsional oscillator having out-of-plane motion.

The characteristics of MEMS devices in accordance with the present invention will be described herein with respect to microelectromechanical probes such as those which are used for scanned probe microscopy, including scanning tunneling microscopy and atomic force microscopy. Such a device is illustrated at 10 in FIG. 1 as including a cantilevered beam 12 connected to a surrounding substrate 14 by a torsional bar 16. As illustrated, the torsional bar is perpendicular to beam 12 and is secured at its outer ends to a pair of mounting posts 18 and 20 which form a part of the surrounding substrate and which support the cantilevered beam for pivotal motion about bar 16. Attached to beam 12; for example near one end thereof, is an atomically sharp tip 22 which is perpendicular to the plane of beam 12 and torsion bar 16 and which acts as a sensing probe. Also carried by beam 12 are comb-type capacitive transducers generally indicated at 24, 26, 28, and 30 which are carried by perpendicular arms 32, 34, 36, and 38 which are integrally formed with the cantilever beam 12. The comb-type transducers can be used for sensing the displacement of beam 12 or for inducing motion in the beam, and these capacitive transducers are the source of the parametric excitation of the MEM structure in accordance with the invention. Such a probe device with its transducers typically covers an area of about 150 $\mu m^2$, and in one embodiment such a device had the following parameters:

$$k=2.75\times10^{-8}N^{\circ}m,\ I=2.12\times10^{-19}kg^{\circ}m^2,\ \gamma=1.216\times10^{-12}N^{\circ}m/V^2,$$
$$A_{ACmax}=A_{DCmax}=38V,\ \text{and}\ Q=3000.$$

The comb-type transducers preferably utilize interdigitated stationary and movable metal-coated fingers which serve as capacitive plates, the stationary fingers, such as fingers 40, being mounted on the substrate 14 and the movable fingers, such as the fingers 42, being mounted on the cross arms, such as arm 32. The fingers may be 1 $\mu m$ wide, 20 $\mu m$ long, and 10 $\mu m$ deep, with a 2 $\mu m$ gap between electrodes and a 5 $\mu m$ gap between the device electrodes and the substrate. These plates, when excited by a suitable driving voltage, provide a wide range of motion for beam 12 in a direction perpendicular to the plane of the device and provide reasonably high amplitudes of motion without failure.

Figure 2:
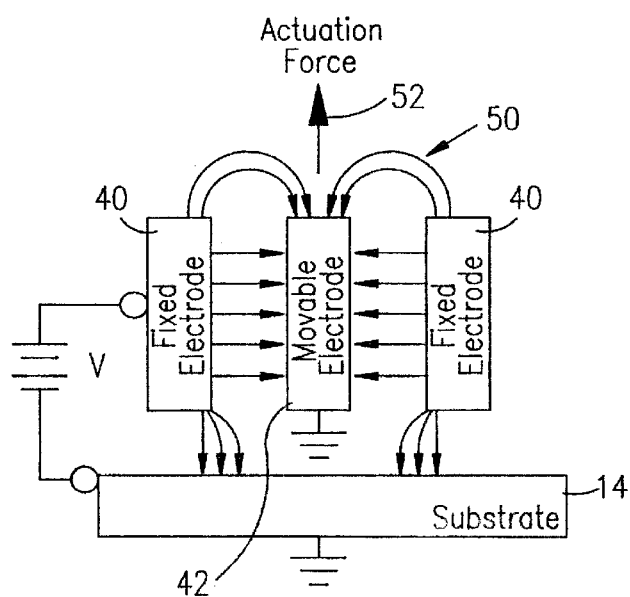
FIG. 2 is a schematic diagram of comb-drive levitation with one movable electrode and two fixed electrodes.

This type of actuator generates out-of-plane forces, and thus motion, by a phenomenon known as comb-drive levitation. As illustrated in FIG. 2, when a voltage V is applied to the fixed electrodes, such as electrodes 40, while the substrate 14 and the movable electrodes, such as electrodes 42, of the interdigitated fingers are grounded, an asymmetrical fringing electric field, generally indicated at 50, is produced between the movable and fixed electrodes. This field induces motion in the movable electrodes in the direction illustrated by arrow 52 in FIG. 2 to provide the out-of-plane motion.

Figure 3:
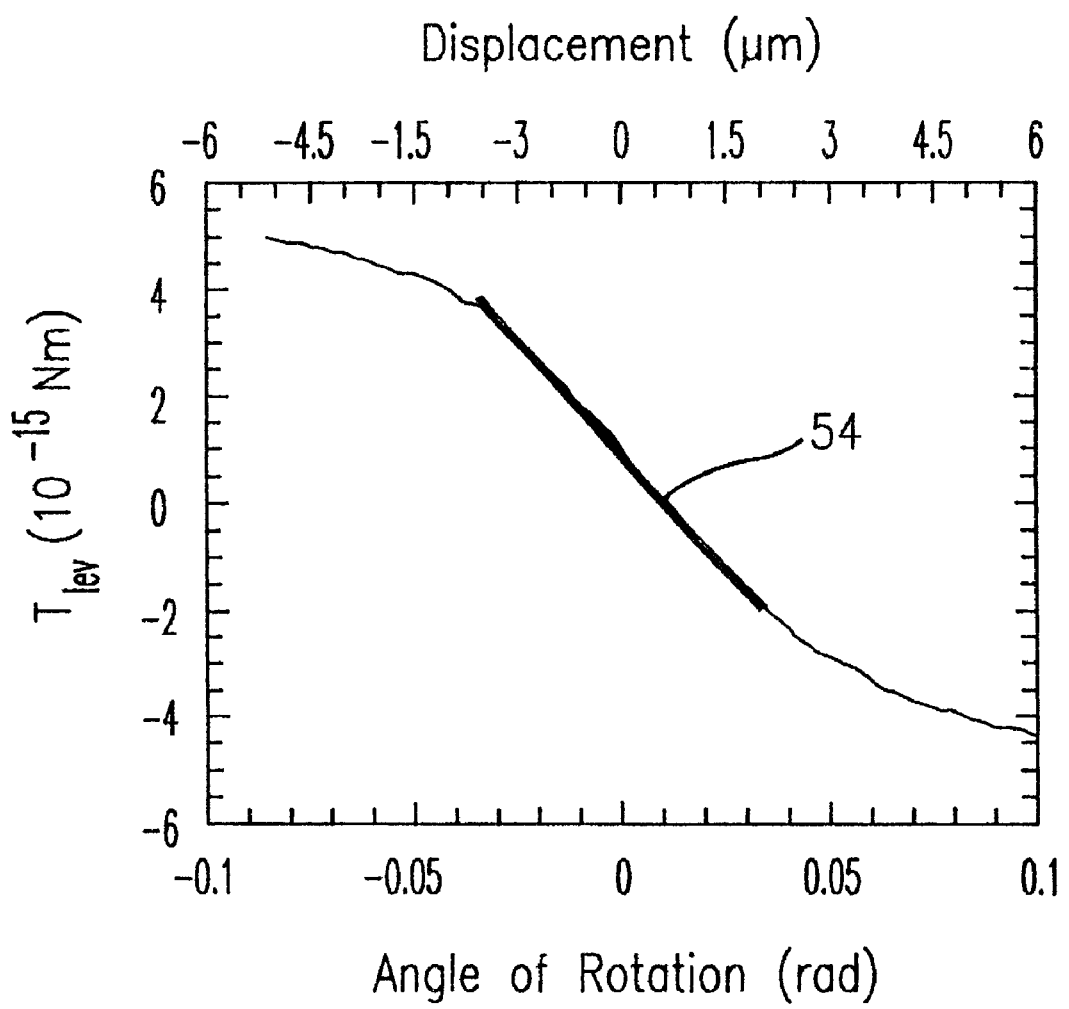
FIG. 3 is a graph illustrating torque generated versus angle of rotation for one movable electrode and two fixed electrodes, with the displacement of the end of the cantilever being displayed along the top axis.

The out-of-plane force generated by the comb-drive levitation effect illustrated in FIG. 2 is illustrated in FIG. 3, wherein curve 54 illustrates the electrostatic torque versus the angle of rotation for one movable electrode. In one embodiment, a maximum rotation of 0.017 radians was obtained. This curve illustrates that, for the region of motion of interest, the relationship is approximately linear.

Torsional oscillators such as that illustrated in FIG. 1 have been fabricated using a derivative of the SCREAM bulk micromachining process described, for example, in U.S. Pat. No. 6,000,280. The SCREAM technology has benefits over surface micromachining techniques, for very high aspect ratio structures can be fabricated, which have extremely high out-of-plane spring constants which help to isolate desired directions of motion from undesirable ones. For devices which are going to be used for atomic force microscopy or scanning tunneling microscopy, there are additional steps involved in creating the atomically sharp tips necessary for tunneling or sensing, and these steps are described, as well as the steps for fabricating the main MEM structure.

Figure 4:
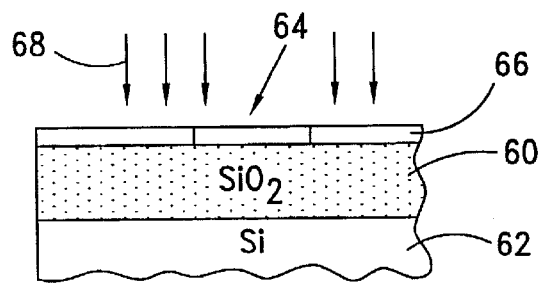
FIGS. 4–7 diagrammatically illustrate a process for fabricating an atomically sharp sensing tip for a cantilever.
Figure 5:
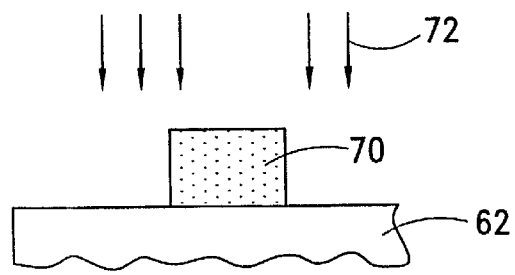

To begin the tip fabrication process, a 0.5 $\mu m$ (FIG. 4) layer 60 thermal oxide is grown on a blank 100 single crystal silicon wafer 62. The oxide is grown at 1100 degrees and is patterned, as at 64, in a resist layer 66. The pattern is transferred to the oxide using an anisotropic $CHF_3$ dry plasma etch 68 to define a 0.4 $\mu m$ pillar 70 on the wafer (FIG. 5). After the oxide is etched all the way through, the resist is removed from the wafer.

Figure 6:
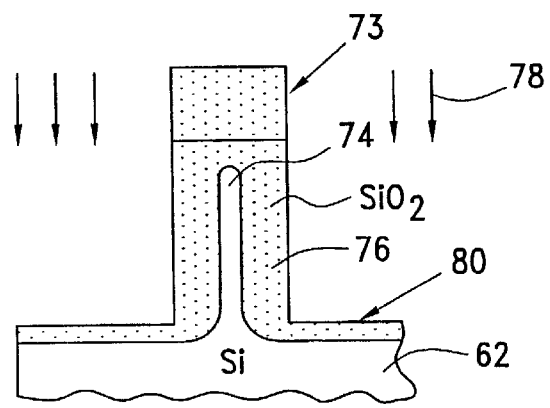

A chlorine-based etch 72 is used to transfer the pattern into a silicon substrate. This anisotropically etches into the silicon; ideally, the silicon is etched down 4–5 μm to form a pillar 73. Following the etch, the pillar and the surface of the wafer are thermally oxidized (FIG. 6) partially through the pillar to create a sharp tip 74 of silicon covered with oxide 76. It is known that silicon oxidizes more quickly in areas of high curvature; thus, if a pillar of silicon is oxidized, the oxidation occurs less rapidly at the base of the column. Therefore, the silicon pillar 73 will oxidize through at the top, leaving behind a small tip 74 due to the rate of oxidation being slower at the bottom. When oxidizing, care must be taken to avoid under-oxidizing the pillars, for if this happens, the tips 74 do not form, and there is not enough oxide covering the pillars to protect them from further destructive etching later on in the process. However, overetching is not a problem. The tips still form, even when over-etched, and the uniformity is still good. The height of the tips varies depending on oxidation time, but sharp tips remain.

Figure 7:
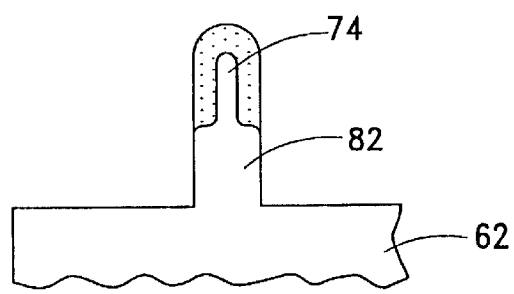

Once the tips are formed, the oxide is left on the wafer 62. To create a base for the tip to sit on, the silicon must be etched again. First, the thermal oxide just grown is cleared from the substrate of the wafers. This is accomplished using another anisotropic $CHF_3$ based oxide etch 78. The tip 74 is still protected by an oxide layer, since it has a lot more sacrificial oxide; clearing the floor 80 only removes a small amount of the oxide on the tips. After the floor 80 is cleared, a chloride-based plasma etch is performed to define a support base 82 (FIG. 7). The base may be defined to be ~5 μm tall, one form of the invention. If it is too tall, subsequent oxide depositions will not cover it thoroughly, and will cause problems later in the etch, but it should be tall enough to allow for easy positioning and placement for sensing. The basic fabrication process for the bulk micromachining process used to make the MEM device is known as SCREAM. It is a one-mask process, and produces very high-aspect-ratio structures, meaning it has reduced stiffness in the direction of motion, but can be extremely stiff in other axial directions, effectively decoupling the axes. This can be very beneficial for many applications. A modified SCREAM-I process such as that preferred for the present invention is illustrated in FIGS. 8–13.

The SCREAM process has been modified to use a combination of an $SF_6$ based isotropic etch and polymer deposition steps in sequence, to create deep silicon structures which maintain a high aspect ratio. This type of etching allows deeper etching and allows a wide variety of structures to be formed. Trench aspect ratios of 50:1 can be achieved, as well as through-wafer etching, and the entire process from start to finish to be completed in Forty-eight hours.

Figure 8:
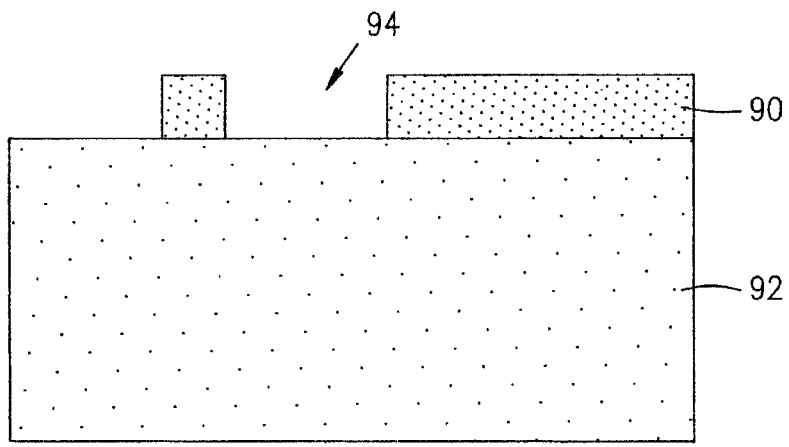
FIGS. 8 through 13 diagrammatically illustrate a process for fabricating the cantilever structure for the device of FIG. 1.
Figure 9:
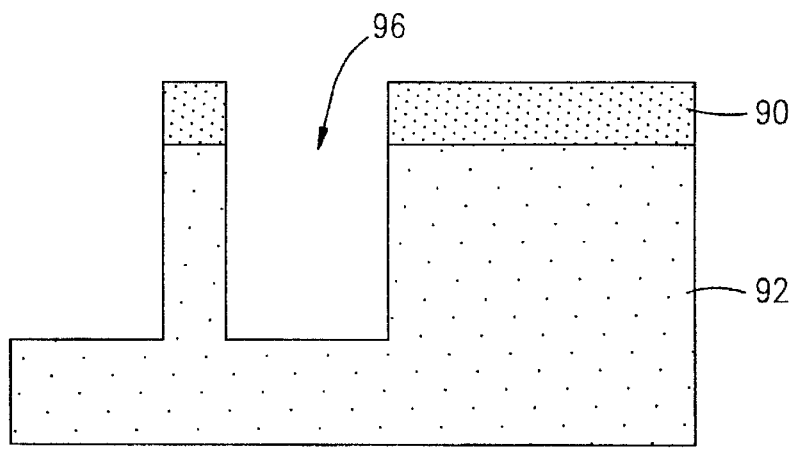

The deep SCREAM process used in the present invention began by growing layer 90 of thermal oxide to a thickness of about 1 μm on a bare (100) silicon wafer 92 (FIG. 8). For the device described herein, a wafer with p or n-type dopants can be used. PECVD (plasma enhanced chemical vapor deposition) oxide can be used in place of thermal oxide for the deep SCREAM process, but thermal oxide provides a more uniform and dense layer than PECVD. With thermal oxide, isolation can be achieved with a much thinner layer of material, and is preferred. In addition, the quality factor is increased for devices with thermal oxide as opposed to PECVD.

For devices being made with integrated tips, such as tip 22 in FIG. 1, the oxide is deposited on a wafer with a tip 74 previously fabricated. The process continues in the same fashion, whether or not there are tips on the wafers.

Next, the oxide 90 was patterned, as at 94, using conventional photolithographic techniques. The wafer was primed with an HMDS vapor prime, and a resist was spun onto its top surface. For SCREAM which is 20–30 μm deep, a resist ~2 μm thick is used. The resist was patterned using a 10X i-line stepper, and was developed. After development, a careful check of the exposure was done using an optical microscope. The lines of minimum feature size were checked to make sure that they were straight, and that the edges and corners were sharp. After optically checking the minimum features, the wafers were descummed using a barrel asher. This step removed the 2 nm layer of resist and cleaned up the features.

The wafer 92 was etched using an anisotropic $CHF_3$ based oxide etch in a magnetron RIE. This etch transferred the pattern 94 to the wafer, as at 96, without changing the features because of the selectivity of the $Bosch_{tm}$ two step process used for this purpose. One step uses an $SF_6$ based etch which etches the exposed silicon, and the second step passivates the exposed silicon on the sidewalls, protecting it from further damage. The etch has a selectivity of silicon to resist of >70:1 and a selectivity of silicon to oxide of >250:1.

The deep silicon etch parameters can be adjusted to create different profiles, but in this case, a straight profile is desired. Finished devices using this process ranged from 8–25 μm deep, depending on the particular device and etch. To keep the sidewalls straight parameters such as time, gas ratios, and RF power are varied in both etch and the deposition steps. The etch has a loading effect caused by the inability of the etch species to come in contact with the exposed silicon. Thus, areas which are open will etch more aggressively than areas which have more. masked surface. To etch tight trenches, the etch parameters must be adjusted so that the etch is more aggressive as the etch goes deeper and deeper, while still passivating the sidewalls thoroughly. This can be done using a process parameter adjustment known as morphing, where the parameters are adjusted for each subsequent step. Increasing the power and/or the etch time can make the etch more aggressive as the depth increases, therefore retaining straight sidewalls.

Figure 10:
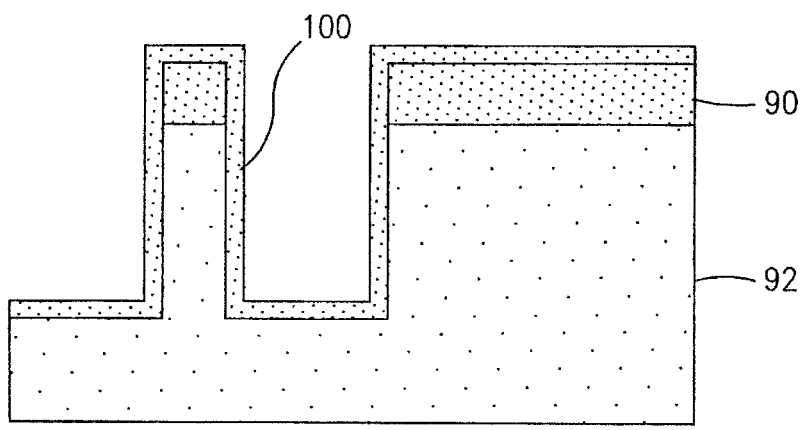

After deep etching, the resist was removed from the wafer with an oxygen plasma etch. The sidewalls were further protected by oxidizing, creating a thermal oxide sidewall 100 on all of the beams (FIG. 10). If thermal oxide is used, only a ~120 nm thick is necessary for isolation. If PECVD is used, approximately 350 nm is needed to provide a good barrier for isolation.

Figure 11:
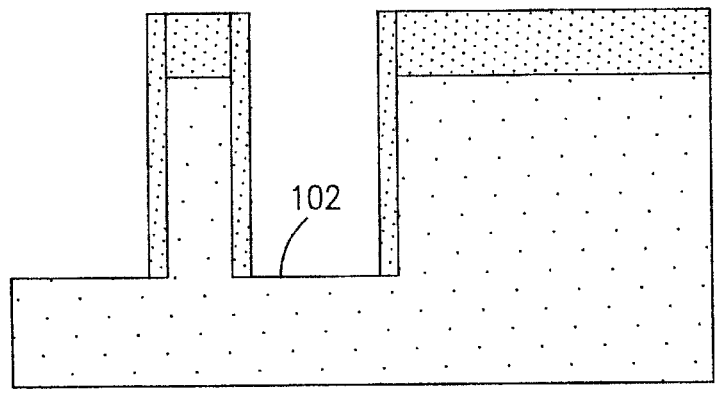

The floor 102 must then be cleared for the release step, shown schematically in FIG. 11 To do this, the floor oxide was removed using an anisotropic $CHF_3$ oxide etch, for example, in a PlasmaTherm 720 etcher. An additional over-etch was done as well. This was to serve two purposes. The first was to make certain that there was no oxide left on the floor between small features, such as between comb fingers. The etch species have a harder time getting into small areas, and it takes longer to remove these products. In addition, the over-etch was done to remove some oxide from the top of the wafer. This was done for stress reasons, for thermal oxide has large thermal mismatch when compared to silicon. Thus, when beams formed by this process are at room temperature, there is a lot of stress between the silicon and the oxide which tends to cause the beams to bow out of the plane when they are released. The final thickness of oxide must balance the oxide 'skirt' 104 (shown in FIG. 13) at the bottom of released beams 106, which is not confirmed by the silicon, in order for the final structure to remain planar. Ideally, the wafer should end up with ~800 nm of thermal oxide on top of the beams to keep the device planar. If PECVD oxide is used, it is not as crucial, because PECVD oxide produced by the CNF deposition system does not contain as much stress as thermal oxide.

Figure 12:
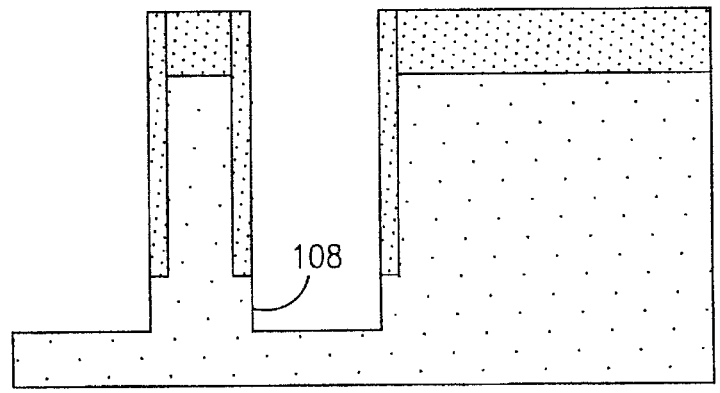
Figure 13:
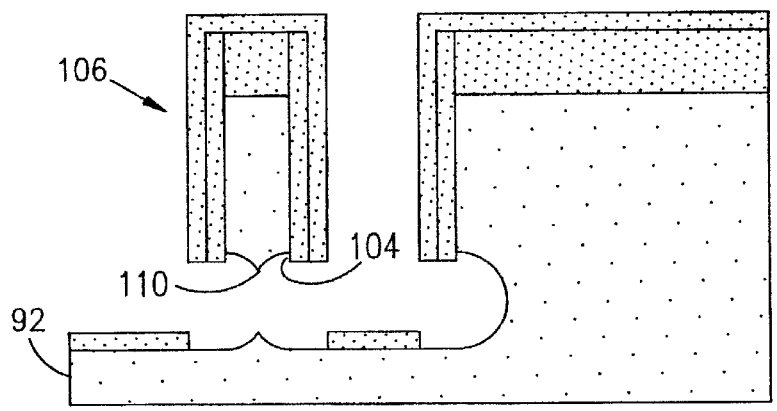

The beams were released as illustrated in FIGS. 12 and 13. Unlike SCREAM, the release was also done using the deep RIE tool. First, like in SCREAM, an extension etch 108 was done, using the same etch step as the first deep-RIE step. The Bosch process was used, and morphing was used with the same recipe as earlier in the process. The number of steps used in this etch, as well as in the release etch, determined how far from the substrate the beams are. This is very important when designing torsional actuators, for the distance of the substrate determines the maximum out-of-plane motion achievable with the actuator. The deep RIE technique proves ideal for such an application, as the substrate can be a lot further from the device than when using conventional chlorine etching. Torsion devices fabricated in accordance with this invention ranged from 5 μm to 20 μm between the bottom 110 of the structural beams 106 and the substrate 92 beneath the beam. This allowed for large out-of-plane displacements. The release etch was done in the deep-RIE tool, but using a pure $SF_6$ etch, which isotropically etched through the silicon underneath the beams and released them from the substrate. A longer $SF_6$ etch will cause the beams to be further from the substrate. The $SF_6$ plasma also consumed silicon on the underside of the beams, as illustrated in FIG. 13

Figure 14:
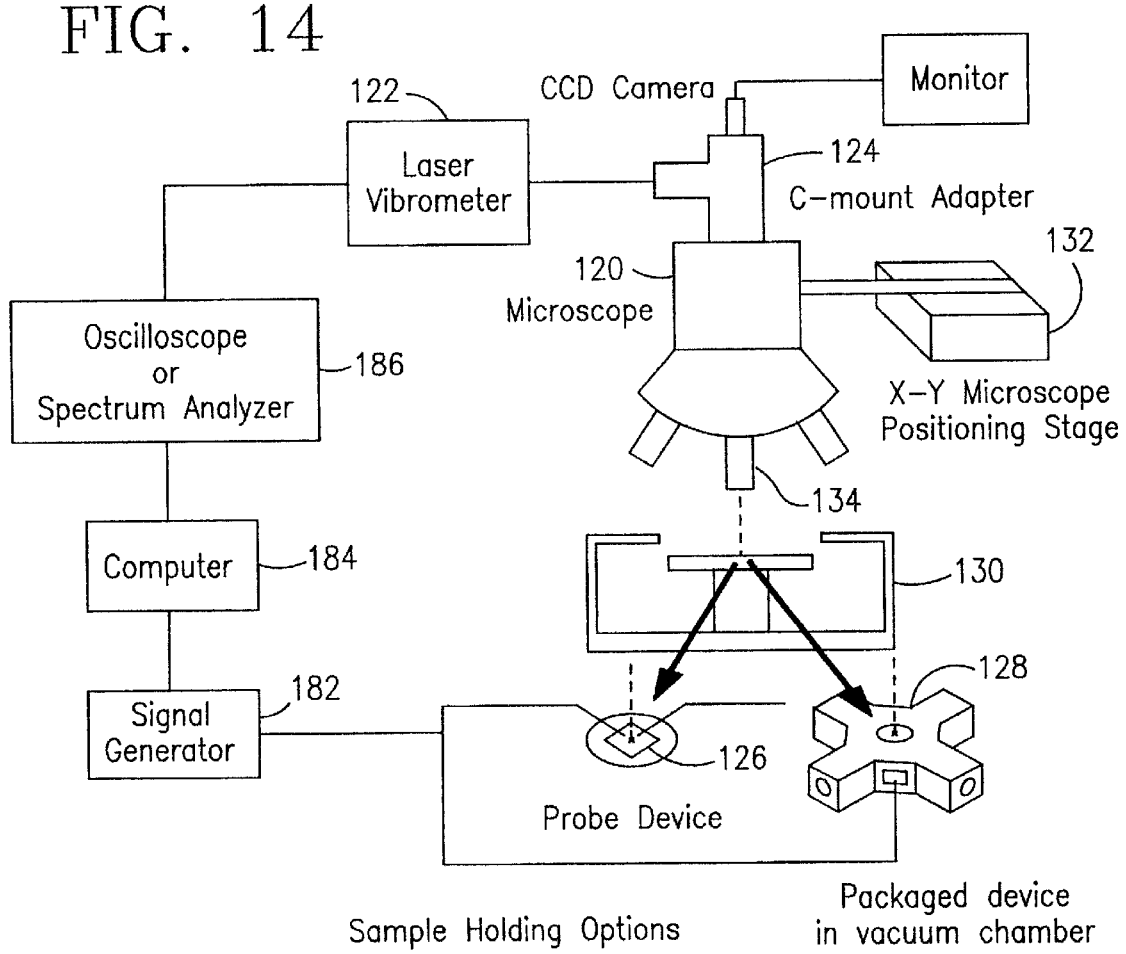
FIG. 14 diagrammatically illustrates a vibratory measurement system suitable for measuring the motion of the oscillator of FIG. 1.

Measurement of a MEM structure such as that illustrated in FIG. 1 was carried out in a vibratory measurement system such as that illustrated in FIG. 14 A free-frame optical microscope 120 with a long working-distance (about 20 mm) objective lens and a fiber optic laser vibrometer 122 with a "c-mount" camera adapter 124 were used to illuminate and image a MEMS device 126 mounted in a vacuum chamber 128 and carried by a stage 130. The microscope included a mechanical X-Y positioning mechanism on 132 for positioning its lens 134 over the sample 126 for imaging. The microscope lens can be positioned manually or by the use of motor drives operated under computer control. The sample 126 is fixed relative to the base of the microscope 120 and is mounted in a variable-pressure vacuum chamber 128. The system facilitates access to the fixed sample for electrical or fluidic interconnects, while the long working distance of the objective lens and fixed sample configuration facilitates access to the sample for additional analytical equipment.

Figure 15:
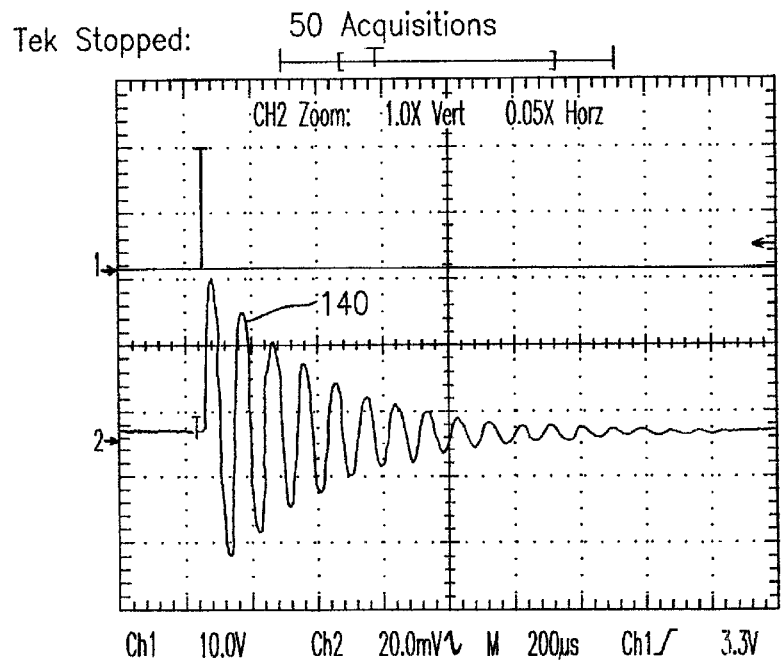
FIG. 15 illustrates the resonant vibration of a cantilever such as that illustrated in FIG. 1.

As noted above, a torsional device such as that described above is activated by the application of a voltage across adjacent capacitor fingers. The device may be set in motion by the application of a very narrow pulse, and the response of the torsional device to that pulse is the "quality factor" or "Q" of the structure. The motion of the device in response to such a pulse may be measured by a vibrometer, and such measurements show that in response to a narrow drive pulse torsional devices oscillate with declining amplitude over a period of time. This oscillation is illustrated by curve 140 in FIG. 15 The Q of the device is defined as $2\pi$ times the number of cycles required for the energy in the oscillator to diminish by a factor of 1/e. Since the energy is proportional to the square of the amplitude for a simple oscillator, the number of cycles for the ringing amplitude to decrease to $e^{-1/2}$ of the starting amplitude is the Q of the device, and Q is easily determined by measuring this quantity.

In a parametric device having a high degree of stiffness, the measurement of Q is carried out as follows. In a directly forced standard constant coefficient second order system, the equation describing its motion is:

$$\ddot{x}+2c/m\dot{x}+k/mx=f/m \cos \omega t \quad \text{(Eq. 3)}$$

If Equation 3 is solved when ω is near the resonant frequency of the device, the frequency response can be described by the following equation:

$$\text{Amplitude} = \frac{F/m}{\sqrt{(\omega_0^2 - \omega^2)^2 + 4\omega^2(c/m)^2}} \quad \text{(Eq. 4)}$$

This describes the commonly known frequency response for standard second order systems. In Equation 4, 1/(2c)=Q. So if Q is infinite, the amplitude of the response, as described in Equation 4, is infinite when $\omega=\omega_0$.

Figure 16:
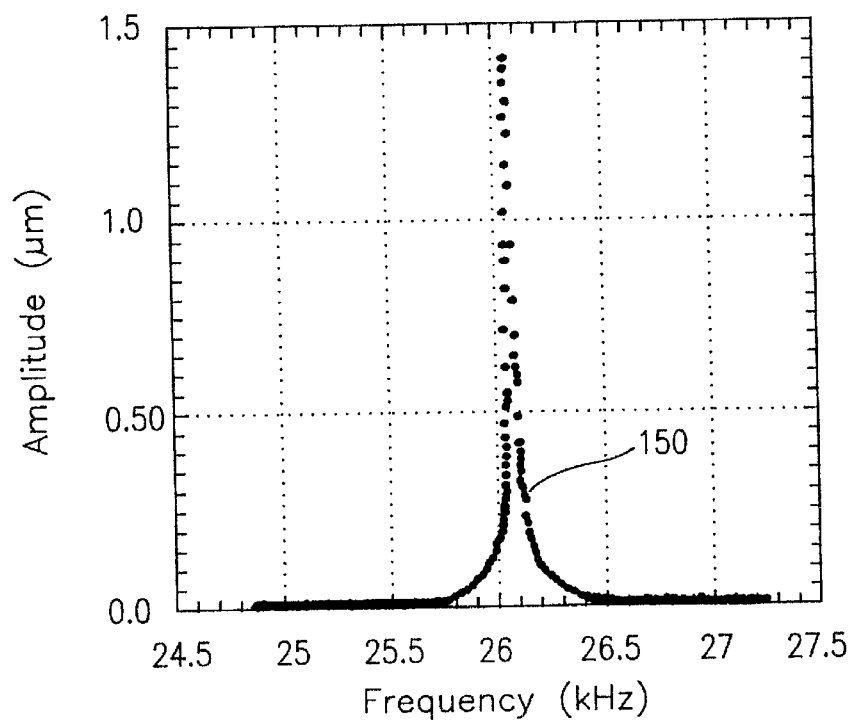
FIG. 16 is a diagrammatic illustration of the frequency response for a torsional oscillator operated in a nonparametric resonating state.

From measurements of comb-drive levitation illustrated in FIG. 3, it is noted that the slope of the curve 54 is not centered exactly at the origin. There is a small offset, which depends on the distance of the movable beam from the wafer substrate. This small offset adds an additional term into the equation of motion, giving the following result:

$$I\ddot{\theta}+c\dot{\theta}+\left(k+\frac{V^2\gamma}{2}-\frac{V^2\gamma}{2}\cos 2\omega t\right)\theta = \frac{V^2\theta_0}{2}(1-\cos 2\omega t) \quad \text{(Eq. 5)}$$

where ω is the driving force, θ is the angle rotated, is the applied potential difference between the fixed and movable comb fingers in the device, and $\theta_0$ is the equilibrium point of the actuator. Equation 5 has the form of the Mathieu equation, except that it has an added driving term on the right hand side. When driven at frequencies near $\omega_0=2\omega$, (near n=2 instability region) the equation displays parametric behavior, but it is coupled with a more traditional non-parametrically forced resonant behavior. Since damping raises the regions of instability within the parameter space, for small driving amplitudes in MEMS devices, the parametric instability is inaccessible, and the only response observed is the typical second order system response, a response illustrated at curve 150 in FIG. 16. Q is defined as the ratio between the frequency of peak amplitude and the bandwidth of the frequency response at the half-power points of the system. FIG. 16 shows the experimental frequency response. At a pressure of 10 mTorr, the device used to take the data in FIG. 16 had a Q of 1091.

Figure 17:
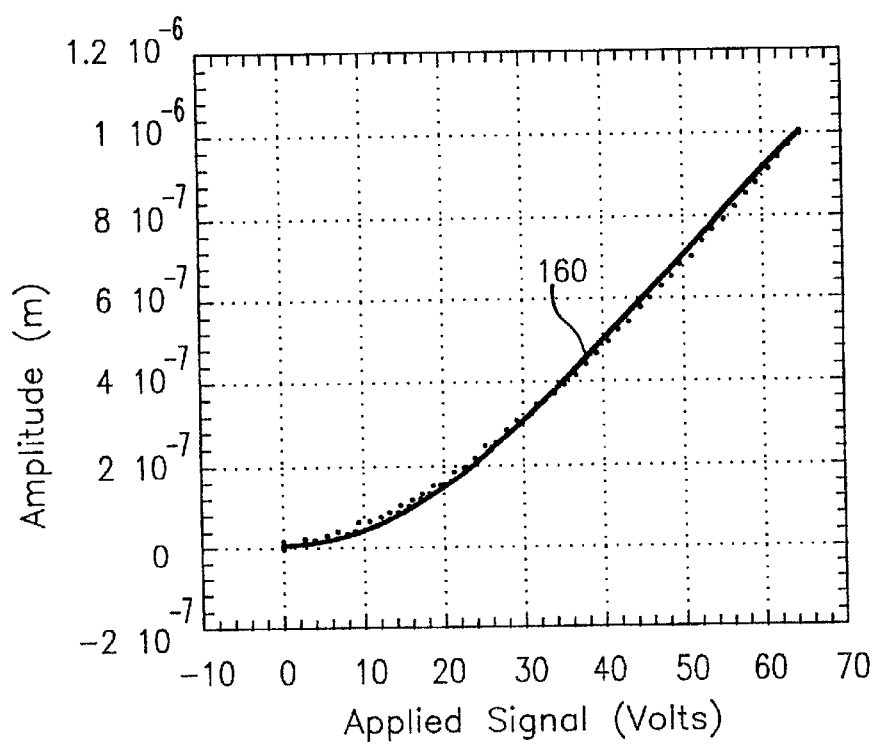
FIG. 17 is a graphical illustration of direct current deflection data, illustrating the static deflection of the device of FIG. 1 supported by springs which were approximately 1.5 micrometers wide, 20 micrometers deep, and 25 micrometers long and including metal and oxide films.

The dynamic behavior of a MEMS parametric oscillator is characterized by its various mechanical properties. For example, static out-of-plane deflection is extremely important, for it allows the experimental calculation of γ, which is the torque versus angle of rotation slope parameter. The static actuator transfer function of displacement versus applied voltage is obtained by applying a wave form that consists of a combination of linear voltage ramps and constant voltages. This wave form may be applied at 1 Hz, to produce a series of displacement measurements at each point of the voltage ramp. An experimental static displacement curve 160 is illustrated in FIG. 17 In this figure, the dots illustrate experimental data while the solid line is a calculated shape. In the device used for this measurement, the movable beams were approximately 20 micrometers from the substrate and the supporting torsion bars were 25 micrometers long with each bar having a high aspect ratio, the bar being about 1.1 micrometer wide and 20 micrometers deep.

Another important parameter is the resonant frequency of the device, which can be determined in a number of ways. For example, a narrow pulse can be applied to the device and the frequency of its motion as it settles back to zero displacement is the natural frequency of the device. This can be measured using standard stroboscopic techniques. The stiffness of the device can be calculated from its dimensions, and the polar mass moment of inertia similarly can be calculated on the basis of the device dimensions.

Figure 18:
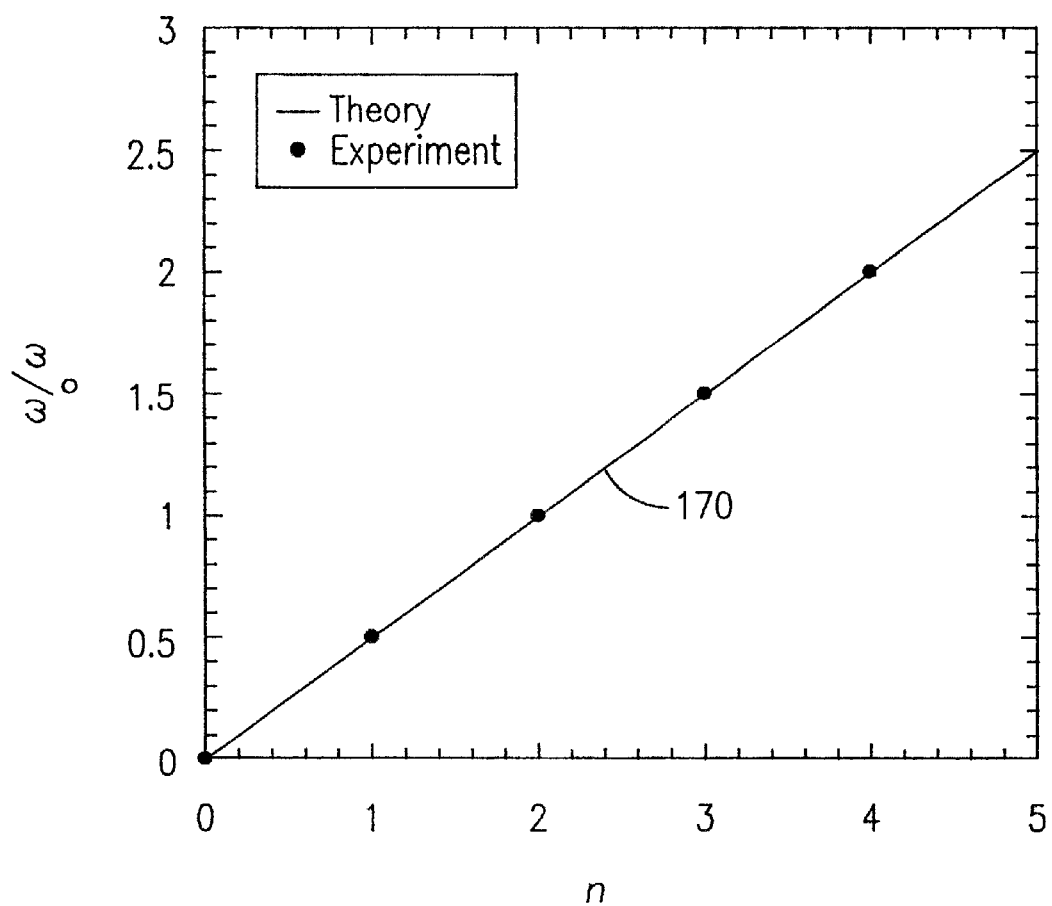
FIG. 18 is a graphical illustration of theoretical and experimental measurements of the frequency ratio for the center of several parametric resonance regions.

As noted above, the natural resonant frequency of a parametric resonator such as the MEM device of FIG. 1 is $\omega_0$, which is the center frequency of the instability region of the oscillator. Other frequencies of instability occur when $\omega=2\ \omega_0/n$. After identifying the natural frequency of the MEM device, the other frequencies which should cause instability can be calculated. Once the approximate frequencies are known, the system can be driven near those frequencies, and with precise frequency control the unstable regions can be identified. These unstable regions are predicted by the Mathieu equations described above, have been experimentally observed, and are illustrated in FIG. 18 In this figure, the dots plot the frequency ratio $\omega_0/\omega$ for the experimentally observed instabilities, while the line 170 illustrates the theoretically-determined values. The center frequencies for the regions of instability are illustrated, and it was found that the instability frequencies matched the theoretical values to within 0.7%.

Figure 19:
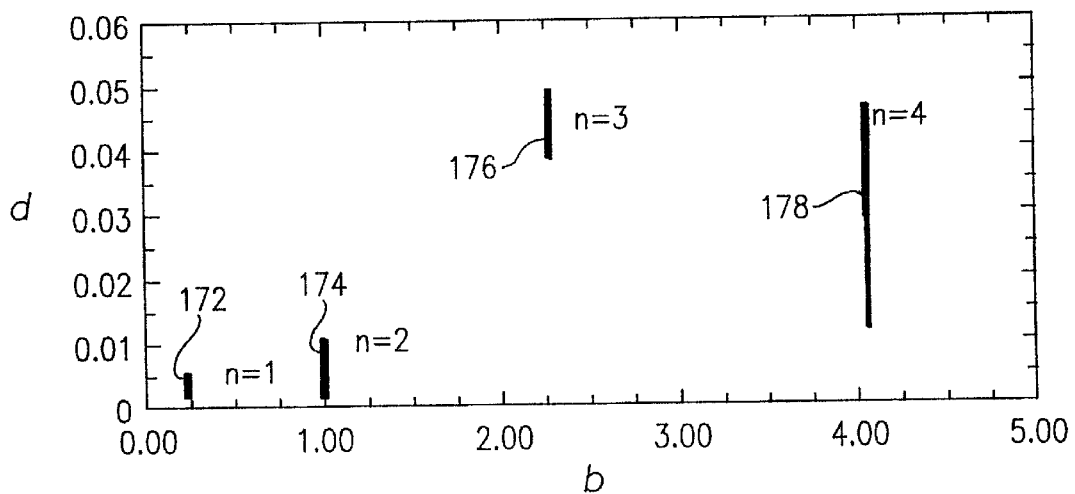
FIG. 19 is an instability map of four regions of parametric resonance for the device of FIG. 1.
Figure 20:
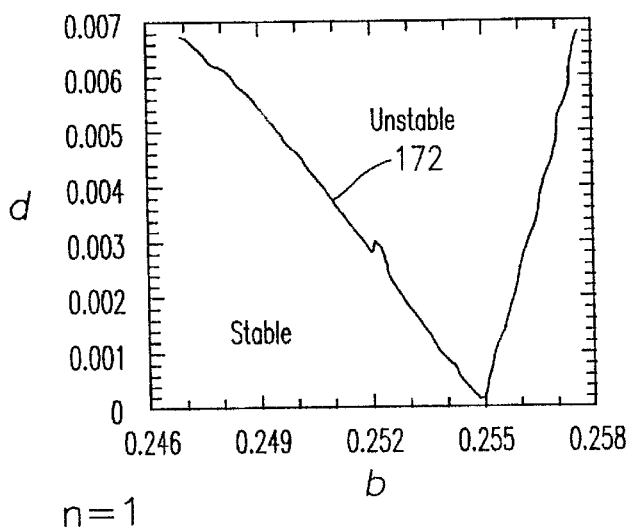
FIG. 20 is a magnified view of the first region (n=1) of instability obtained experimentally.
Figure 21:
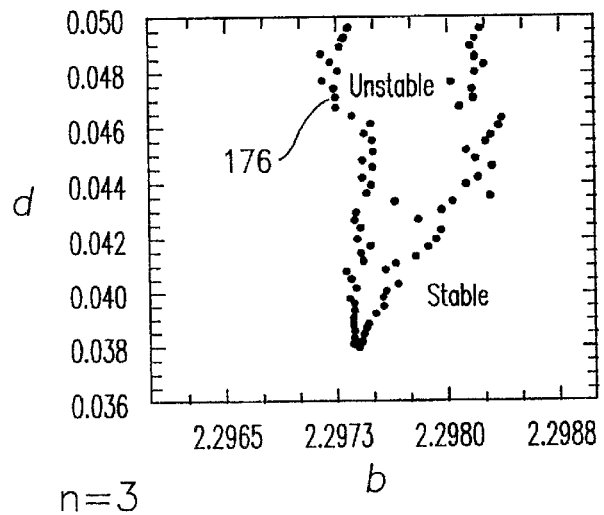
FIG. 21 is a magnified view of the third instability region (n=3), obtained experimentally.

Although the Mathieu equation is only one example of parametric resonance, devices which operate in accordance with that equation have very unique stability regions, for each resonance region occurs within a "tongue" in the $(\beta,\delta)$ parameter space of the MEM device. The shape and position of the resonance tongues are affected by damping of the system, for damping has a stabilizing effect which raises the tongue higher up in the parameter space and narrows the unstable region. FIG. 19 is a plot of four instability regions 172, 174, 176, and 178 for values of n=1, 2, 3, and 4 respectively. FIG. 20 is an enlarged view of region 172, which indicates that the boundary between stable and unstable regions are substantially linear. FIG. 21 is a magnified view of the region 176 for n=3 which illustrates a less linear relationship between stable and unstable regions.

Figure 22:
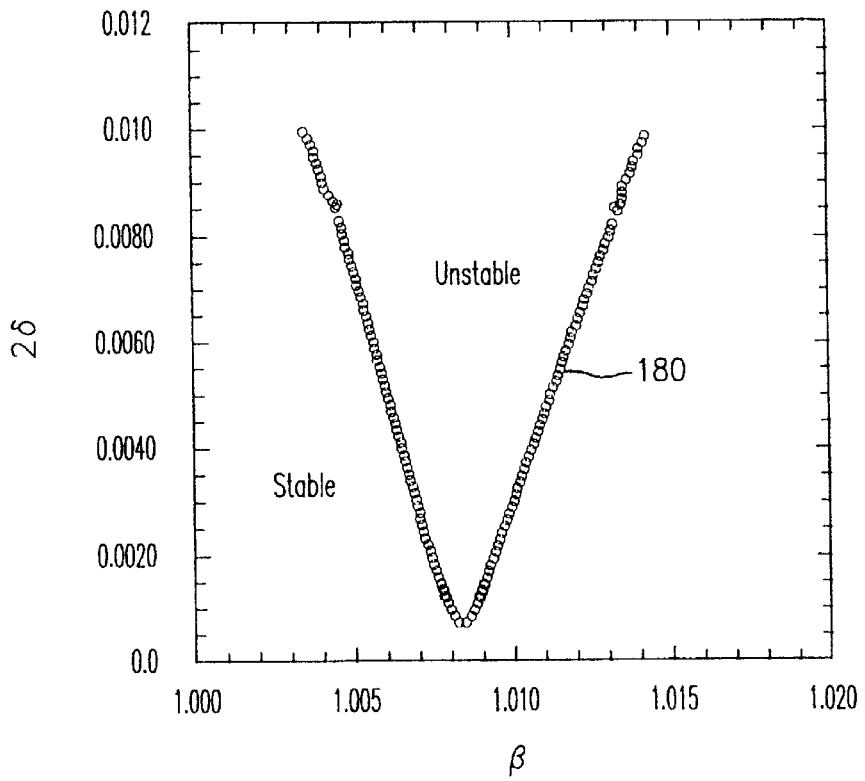
FIG. 22 is an instability map for the region (n=1) obtained experimentally.
Figure 23:
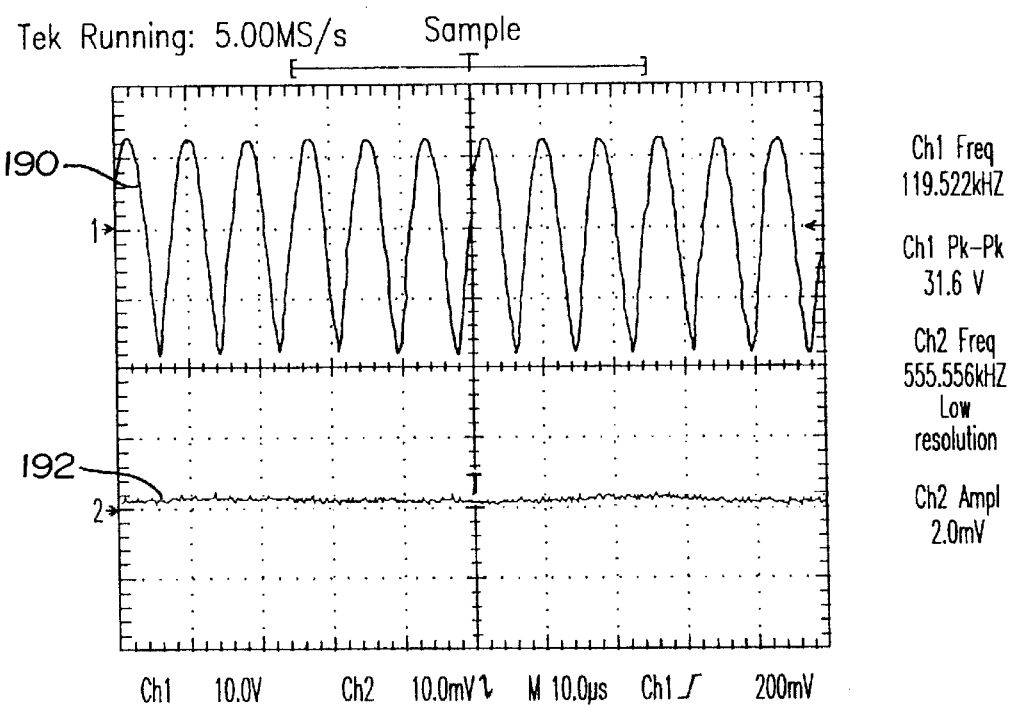
FIG. 23 is an oscilloscope output of a parametrically forced torsional oscillator in a stable parameter region, the top trace being the applied signal and the bottom trace being the output from the vibrometer as measured by the instrumentation illustrated in FIG. 14.
Figure 24:
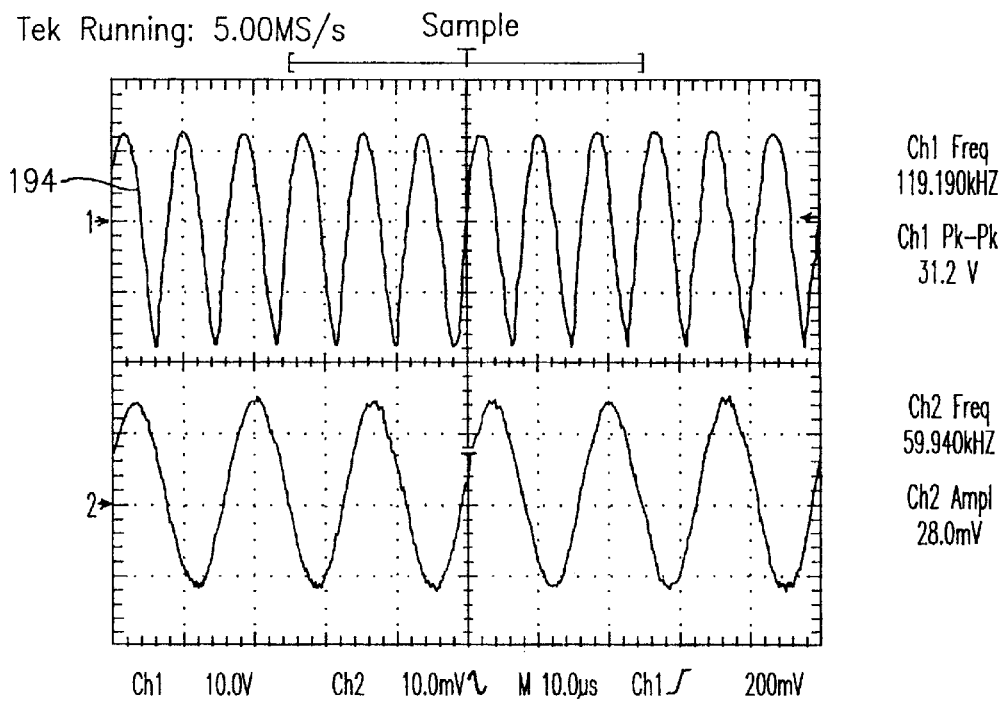
FIG. 24 is an illustration of oscilloscope output when the device is in the n=1 instability region.

The instability regions, or tongues, illustrated in FIG. 19 can be mapped by initially selecting a drive signal having a frequency $\beta$ and an amplitude $\delta$ that produces resonance; that is produces an unstable excitation in the MEM device. By then maintaining a constant amplitude and varying the frequency in very small steps, the boundary between the stable and unstable regions can be determined. The amplitude of the drive signal is then changed and the process is As repeated. Such a map for the device of FIG. 1 for the value n=1 is illustrated in FIG. 22 by curve 180. The instrumentation illustrated in FIG. 14 is used for this purpose, with the signal generator 182 supplying the desired drive signal under the control of computer 184 to the device 126. Motion of the device in response to the signal is detected through the microscope by the vibrometer 122, the output of which is supplied to an oscilloscope or spectrum analyzer 186. FIGS. 23 and 24 illustrate the difference in amplitude of the MEM resonator in the stable and unstable regions. Thus, for example, curve 190 in FIG. 23 illustrates the frequency and amplitude of the drive signal applied across the capacitor fingers of the resonant device 126. Curve 192 is the output from vibrometer 122, illustrating the displacement of the ends of the cantilever beam 12 (FIG. 1), for example at the location of tip 22. As illustrated, curve 192 illustrates that the frequency and amplitude of the drive signal produces a high frequency and low amplitude response in the motion of the beam, thus indicating operation in a stable region.

FIG. 24 illustrates a drive signal 194 having a slightly higher frequency than that illustrated in FIG. 23 which produces in the torsional oscillator 126 oscillation at a frequency ½ that of the drive frequency and with a relatively large amplitude, indicating unstable or resonant operation. As the boundary between the stable and unstable regions is crossed by varying the drive frequency, the motion of the oscillator changes from a very low amplitude to a very large amplitude. It has been found that resonators such as that illustrated in FIG. 1 can produce motion as great as ±8 micrometers when in the unstable region. The transition between stable and unstable regions is very different from a normal resonant excitation so that the values along the transition boundary, indicated by curve 180 in FIG. 22 is easily defined.

Figure 25:
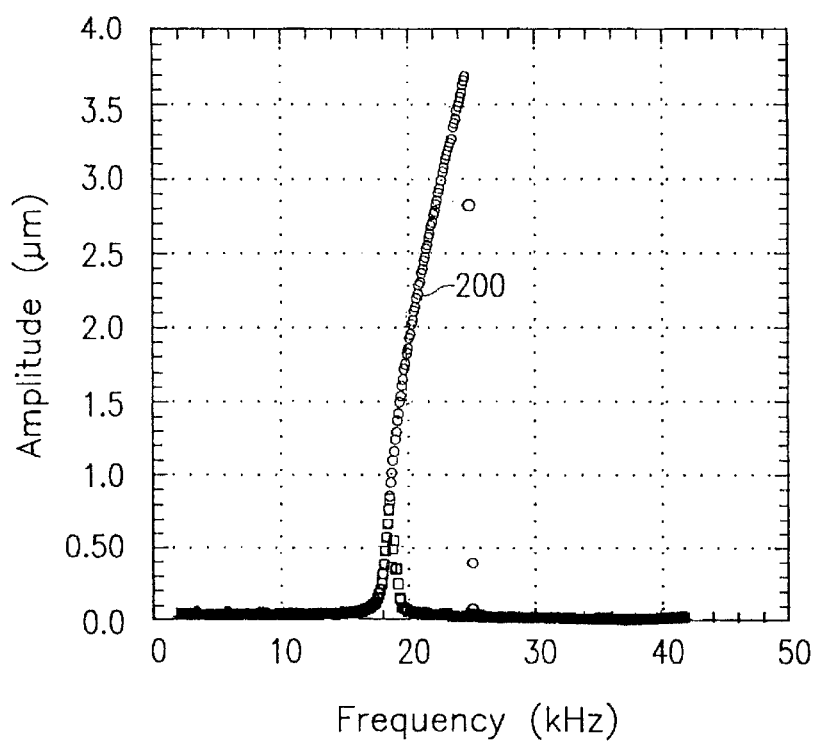
FIG. 25 is a graphical illustration of the frequency response for a directly forced MEMS Duffing-type actuator.
Figure 26:
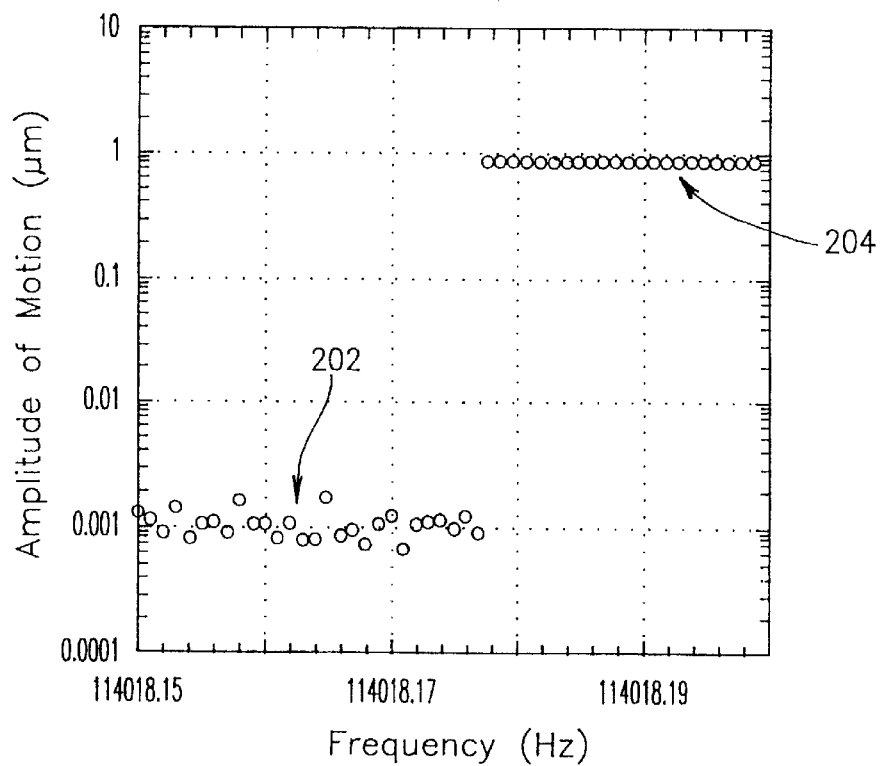
FIG. 26 is a graphical illustration of the frequency response for a typical parametrically forced MEMS actuator illustrating the sharp transition between stable and unstable operation.

The typical frequency response in a MEMS device described by a standard second-order directly-forced differential equation (instead of a Mathieu equation), is illustrated by curve 200 in FIG. 25 As there illustrated, as the frequency increases, the amplitude of motion in the device gradually increases to a maximum amplitude which depends on the Q of the device. There is hysteresis in this curve caused by geometric cubic nonlinearity, which is present in devices with fixed spring geometries. However, the operation of a system exhibiting a Mathieu behavior is completely different, and is illustrated in FIG. 26 As there indicated, the amplitude of motion is discontinuous at the transition frequency, with lower curve 202 representing amplitudes at frequencies which produce stable operation and curve 204 representing the amplitude of motion at frequencies which produce unstable, or resonant motion. In this operation, the dependence on the Q of the device is minimized.

The boundary of the instability region has a number of useful properties. On one side of the transition curve, the motion of the oscillator is stable and its amplitude is small, and with damping, the motion decays to zero. In the unstable region, the motion exhibits resonant excitation with high amplitude motion, and the boundary between the two is very sharp with changes in the drive signal frequency or the drive signal amplitude. The instability region differs from a standard resonant excitation in that with standard excitation, the transition between the stable and unstable regions is dependent on Q, and the growth in amplitude as well as the maximum amplitude are also determined by Q. In the Mathieu-based system, the amplitude and growth rates are not directly determined by Q. When in the unstable region, the amplitude of motion is essentially constant, as illustrated in FIG. 26 at curve 204, with the amplitude being limited only by geometrical or material nonlinearities, and not by the damping present in the system. This is very useful for filter applications.

Figure 27:
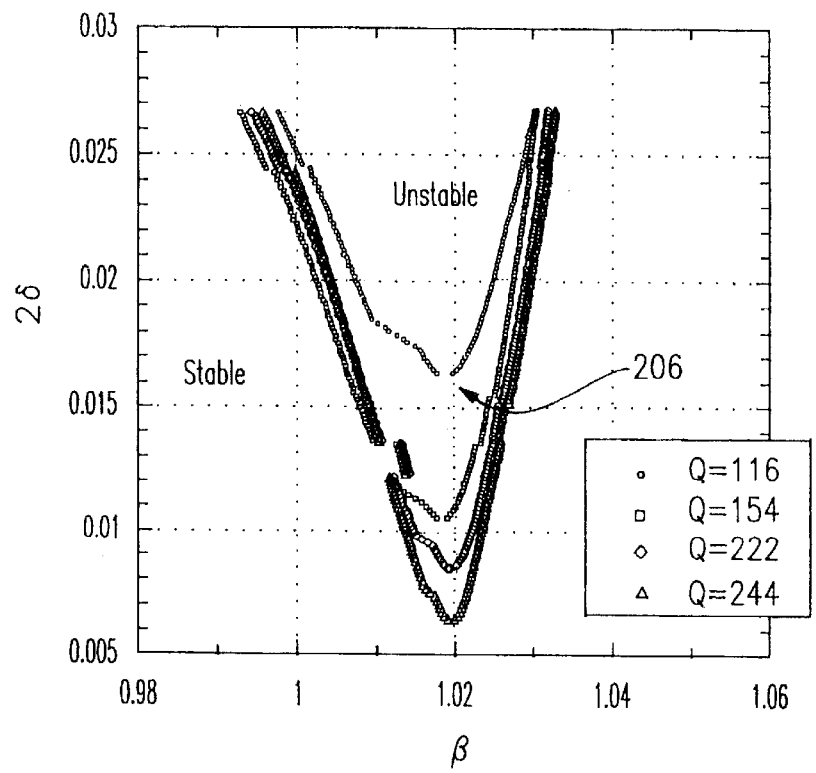
FIG. 27 is a map of the n=1 region of a parametrically forced MEMS actuator for various Q levels obtained by varying the vacuum in which the device operates.

Damping affects the instability regions in predictable ways by causing the instability regions to be smaller and higher in the parameter space, as illustrated in FIG. 27 for the first instability region where n=1. Higher order instability regions also exhibit similar behavior, although in these regions even small amounts of damping are enough to significantly increase the amplitude of the drive signal required to produce unstable operation.

In the illustration of FIG. 27, the Q of the system was varied by changing the pressure in the testing environment, and the transition points between stable and unstable operation were mapped as described above. The mapping illustrated in FIG. 27 was carried out for pressures of 3T, 4.4T, 6,T and 10T, corresponding to changes in Q between 250 and 120. As illustrated, decreasing the vacuum level "rounds off" the bottom edge of the instability region, as illustrated at 206, for example. This also has the effect of narrowing the instability region and with high enough damping, the transition region is rounded off and narrowed so completely that instability becomes inaccessible.

It will be noted that the experimental data represented in FIG. 27 is slightly different than the calculated data, partly because when comb-drive levitation is used to actuate the torsional structure, there is a small asymmetry in the torque versus angle function, particularly for odd values of n. Further, there are differences between the actual stiffness of the device and its mass moment of inertia values, and the calculated values based on measurements taken from the device. Film thicknesses also can vary somewhat across the device, as well as beam depths and dimensions. Small changes in any of these can account for the differences between predicted and actual values.

One advantage of parametrically forced torsional resonance of the present invention is the use of this technique to reduce the parasitic signals in capacitive sensing in utilizing MEMS devices. The motion of many MEMS devices can be detected as changes in the capacitance between movable and fixed elements; such capacitive sensing is a major technique used for MEMS motion sensing. However, due to the close proximity of drive and sense electrodes, and because of imperfect isolation between them, feedthrough currents which are the same frequency as the incoming excitation signal can occur. These feedthrough currents are referred to as parasitic signals, and can be large enough to overshadow the signals representing the capacitance change which is being detected.

In the torsional system described herein, the capacitance change when the device is in motion is very small, due to the small number of movable fingers and the torsional motion. Since the capacitance between adjacent plates is proportional to the area between them, the change in capacitance in such devices is so small that standard capacitance detection techniques have trouble with stray signals. By parametrically exciting the device far from its natural frequency, in accordance with the present invention, the effects of stray parasitic signals can be avoided. For example, a given device with a natural frequency of $\omega_0$=57 kHz will be driven at a frequency $\omega$, which corresponds to the first Mathieu instability, where n=1. In this case, then, $\omega$=2 $\omega_0$/n, or 114 kHz. The parasitic signals will be at the same frequency as the drive signal; namely, 114 kHz. However, since the device will vibrate torsionally at its natural frequency of 57 kHz, the capacitive sensing signals of interest are also at 57 kHz. With this separation in frequency, it is straightforward to filter out the parasitic 114 kHz signal, thereby revealing the 57 kHz sensing signal. In this way, the frequency of interest is removed from the drive signal and allows capacitance detection techniques to be used even when small capacitance changes are being measured.

Microelectromechanical filters are of increasing interest because of the ability to design structures that have a higher Q than is obtainable in electrical systems. These mechanical filters are also desirable because of their flexibility in frequency range. The sharp boundary provided by parametrically forced systems, as described above, enables parametrically forced structures to be used as filters and/or switches.

Figure 28:
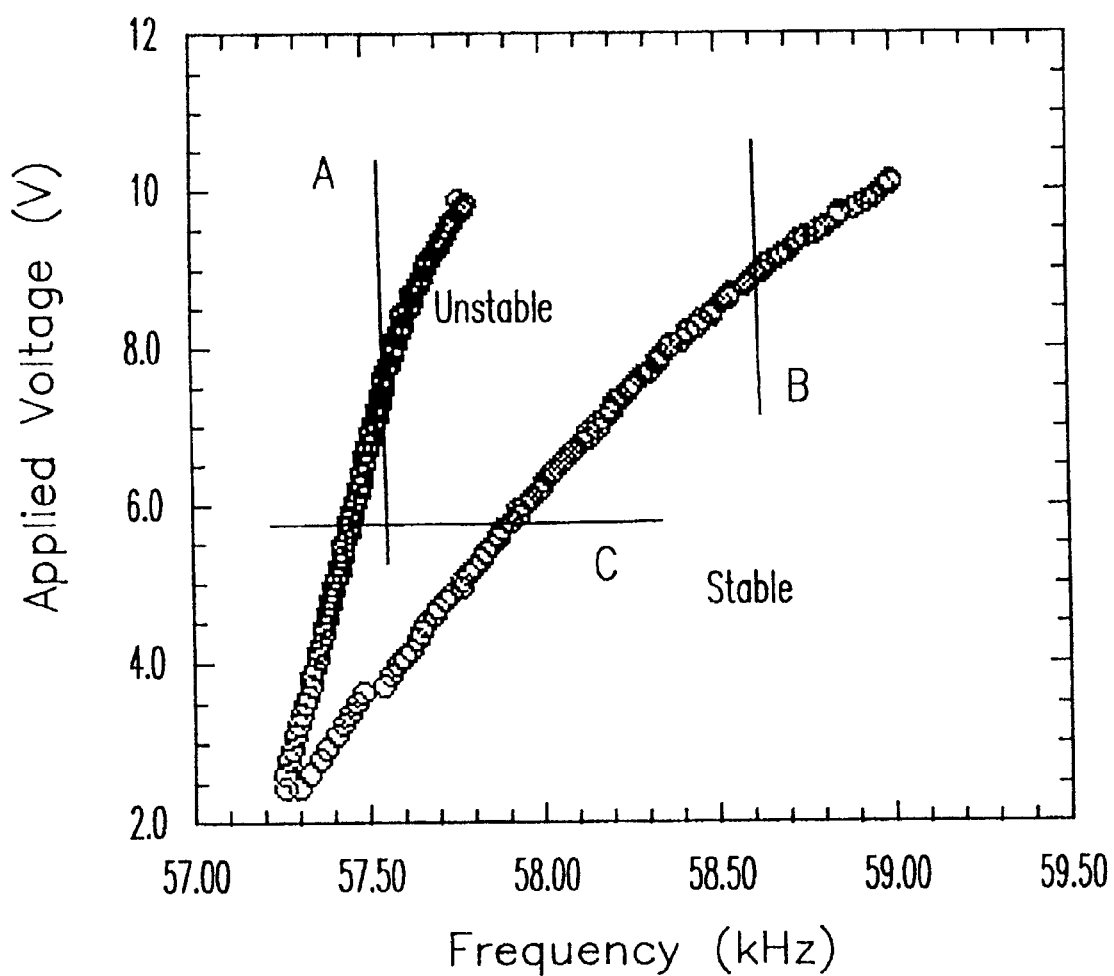
FIG. 28 is a map of the n=1 instability region for a torsional oscillator showing at lines A and B the transitions from stable to unstable operation obtained by changing the applied signal and illustrating at line C the transition obtained by sweeping the frequency.

The transition between a stable and an unstable operating condition in the MEMS of the present invention is extremely sharp, and occurs for a change in frequency of less than 0.001 Hz, according to measurements of experimental devices. In addition, since the structures can be designed to move relatively large distances, providing a large signal to noise ratio, this transition boundary operates as a very sensitive switch which can shift between stable and unstable conditions with changes in either voltage or frequency. Thus, as illustrated in FIG. 28, operation of the device at a given frequency causes it to shift between stable and unstable conditions as the amplitude of the applied signal is varied; similarly, maintaining the drive signal at a given amplitude allows the device to be shifted between stable and unstable conditions by changing the frequency of the drive signal. Such switches have high discrimination between on and off signal levels. With the device having nonlinear characteristics such as those illustrated in FIG. 28, it can be seen that the device can be turned on with one voltage and turned off with a different voltage while holding the frequency constant, as illustrated along vertical line A in the figure. Similarly, by moving along line C in a horizontal direction, the device can be turned on with one frequency and off with another frequency while holding the applied voltage constant. By designing the devices to possess varying degrees of nonlinearity, a large variety of switches can be implemented. The nonlinearities can be reduced by making torsional devices with stiffer springs which do not move as far out of plane, if desired.

The characteristics illustrated in FIG. 28 illustrate how the MEM device of the invention can be used as a filter and/or a switch. Sweeping a range of frequencies while holding the amplitude constant shifts the device between stable and unstable conditions, with the bandwidth of the unstable condition being variable, depending upon the amplitude of the applied voltage. The sharp cutoff at the transitional boundaries, the bandwidth dependence on voltage, as well as a strong sensitivity to input frequencies provide a useful mechanical filter.

Atomic force microscopy has been utilized for many years for a variety of applications, including imaging, but the sensing of very small forces. In such devices, it is extremely important to obtain a very high Q cantilever which is sensitive to its interaction with outside forces. Such cantilevers have atomically sharp tips, such as the tip 22 illustrated in FIG. 1, and accordingly the device of the present invention has significant application in this field. In such devices, sensitivity is obtained due to the fact that with high Q oscillators, small changes in the frequency of the oscillation due to force interaction with the sample can be sensed by measurable changes in amplitude of the vibration, since the force interaction in effect changes the stiffness of the oscillator. The cantilever of the present invention provides a highly sensitive atomic force microscopy.

Figure 29:
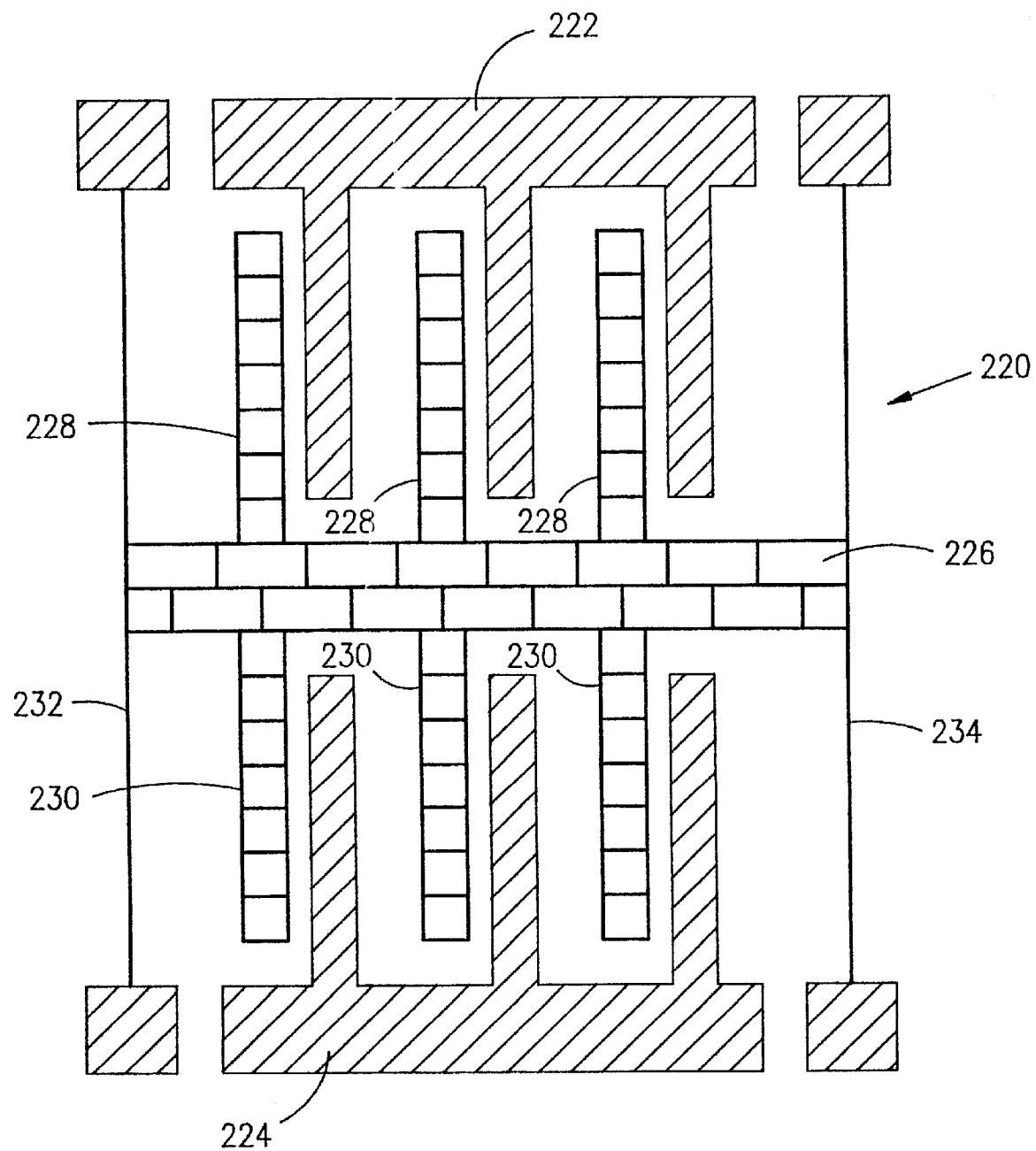
FIG. 29 is a diagrammatic illustration of a parallel plate actuator including an actuator supported for in-plane motion by end springs.

Torsional devices are not the only structures which can display Mathieu behavior; for example, in-plane devices can also display dynamic instabilities of the Mathieu type. Parallel-plate actuators are very common in MEMS systems, and if higher order effects are taken into account, this type of actuator can display parametric resonance effects. FIG. 29 is a schematic diagram of a parallel-plate actuator device, generally indicated at 220, which includes fixed capacitor fingers 222 and 224, and a movable actuator beam 226 carrying movable capacitor fingers 228 and 230 which are coplanar with, parallel to, and spaced from corresponding fixed fingers. The actuator beam is supported at opposite ends by spring arms 232 and 234 which allow the actuator beam to move in the plane of the beam and along its longitudinal axis. The springs 232 and 234 preferably are mounted at their outer ends to the fixed substrate which supports the fixed fingers. The fixed and movable fingers carry electrically conductive layers forming capacitor plates on their opposed faces.

The force law for a parallel plate actuator such as actuator 220 has parametric terms which affect the dynamic behavior of the system. The resultant motion of the system thus may be governed by parametric terms and does not display the behavior expected from a single constant-coefficient equation model.

Assuming the system is rigid in directions other than the primary motion direction, the equation of motion can be written as:

$$m\ddot{x} + c\dot{x} + kx = F \quad \text{(Eq. 6)}$$

Assuming that the amplitude of motion of the actuator is much less than the original gap size, the force between the plates can be written as:

$$F \cong \frac{\varepsilon_0 A}{4d_0^2} V^2 \left(1 + 2\frac{x}{d_0}\right) \quad \text{(Eq. 7)}$$

using a binomial series expansion with only the linear terms retained. For a more accurate model, higher order terms can be retained. If an applied potential difference is applied to the capacitor, as in dynamic or resonant applications, the force equation becomes:

$$F \cong \frac{\varepsilon_0 A}{4d_0^2} \left(1 + 2\frac{x}{d_0}\right) ((A_{DC} + A_{AC}\cos \omega t)^{1/2})^2 \quad \text{(Eq. 8)}$$

which can be rewritten as:

$$F = \frac{\varepsilon_0 A}{4d_0^2}\left[A_{DC} + \frac{2A_{DC}}{d_0}x + A_{AC}\cos \omega t + \frac{2A_{AC}}{d_0}x\cos \omega t\right] \quad \text{(Eq. 9)}$$

If Equation 9 is substituted into Equation 6, the equation of motion becomes:

$$m\ddot{x} + c\dot{x} + \left(k - \frac{\varepsilon_0 A}{2d_0^3}A_{DC} + \frac{\varepsilon_0 A A_{AC}}{2d_0^3}\right)x = \frac{\varepsilon_0 A}{4d_0^2}[A_{DC} + A_{AC}\cos \omega t] \quad \text{(Eq. 10)}$$

which is a linear equation with both a parametric term as well as a driving term. This type of system can be dominated by parametric effects at certain frequencies, and standard resonant forcing at others. It has been found that in the neighborhood of the first instability region, when the external forcing amplitude is below a certain level, the parametric forcing term governs the response. However, when the level of external forcing becomes too high, that effect takes over and becomes the primary response observed.

When written in a generic form, the forced Mathieu-Hill equation is written as:

$$\ddot{x} + 2\mu\dot{x} + (\beta + 2\delta \cos 2\tau)u + hx^3 = e_{DC} + e \cos(2t) \quad \text{(Eq. 11)}$$

When Equation 10 is put into the form of Equation 11 (and a change of variables of $\omega = 2\rho$ is used):

$$2\mu = 2^c/m\omega, \quad \beta = \frac{4}{m\omega^2}\left(k - \frac{\varepsilon_0 A}{Zd_0^3}A_{DC}\right), \quad \text{(Eq. 12)}$$

$$\delta = \frac{2\varepsilon_0 A}{\omega^2 m d_0^3}A_{AC},$$

h depends on the nonlinearity of the springs used in the solution, and $$e_{DC} = \frac{\varepsilon_o A}{\omega^2 m d_0^2}A_{DC}, \quad \text{and} \quad e = \frac{\varepsilon_o A}{\omega^2 m d_0^2}A_{DC} \quad \text{(Eq. 13)}$$

Note that the ratio between the parametric forcing ($\delta$) and the external forcing (e) is $\delta/e = 2/d$. Thus, the parametric forcing in a dynamically forced MEMS parallel plate actuator is ~$10^5$ larger than the external forcing. Simulations of this equation show that for external forcing $10^5$ less than the parametric forcing, the equation still displays parametric resonance behavior when excited in the first instability region, as predicted from the linear theory of the Mathieu Equation.

In an actual MEMS system, there is some nonlinearity to limit the motion of the device. Otherwise the motion amplitude would continue to increase until device failure, which does not happen. At the primary parametric resonance ($\omega = 2\omega_0$), the normalized response should have the period $2\pi n$, while the response due to the external excitation has a period $\pi$. This makes it easy to distinguish between the dominant influences. A cubic nonlinearity is included in the simulation as well, to limit the total response amplitude. A cubic nonlinearity is a good approximation of the nonlinearity present in MEMS devices, for most standard MEMS springs and torsional springs display a cubic nonlinearity at large displacements. The cubic term has an effect on what the minimum amplitude of the external forcing has to be before it dominates the response.

Figure 30:
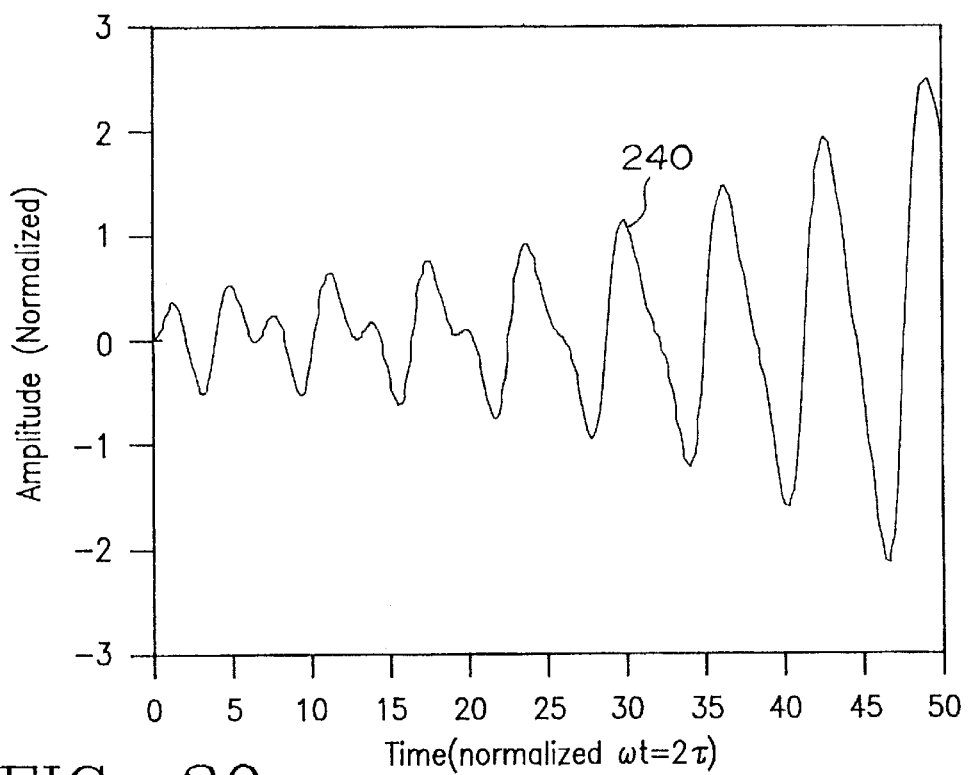
FIG. 30 illustrates the time response produced by Equation 11, where $\beta=1$, $\delta=2$, and $e=1$, wherein a device is actuated in its instability region.

By looking at the normalized time response of the equation, it is easy to see that the response is a parametric one, based on the frequency of the output. A parametric response should be at ½ the driving frequency of the input signal, which in this case is period $\pi$. So the output waveform should have a period of $2\pi$, based on the linear theory discussed earlier. As seen in FIG. 30 ($2\mu = 0.001$, $\beta = 1$, $\delta = 0.2$, h=0.1, e=0.000002), the response curve 240 quickly becomes period $2\pi$, and grows in amplitude. This is characteristic of a parametric oscillation.

Figure 31:
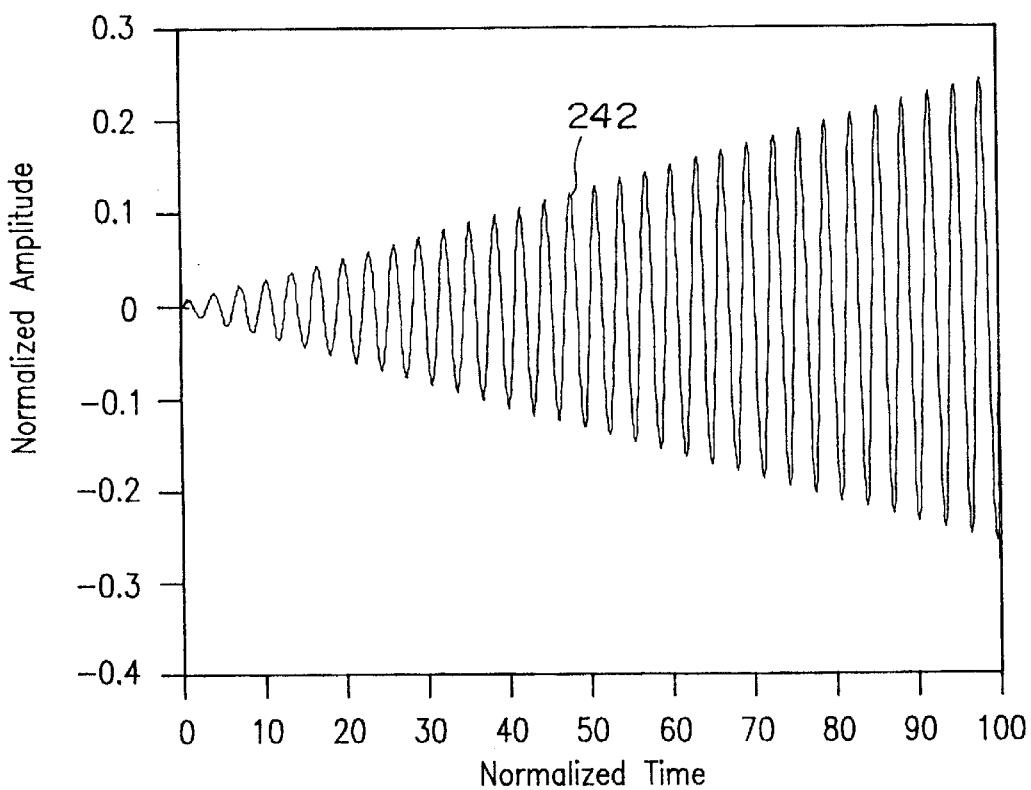
FIG. 31 illustrates the time response of Equation 11, with $\beta=4$, $\delta=0$, and $e=0.01$, in which there is no parametric forcing term.
Figure 32:
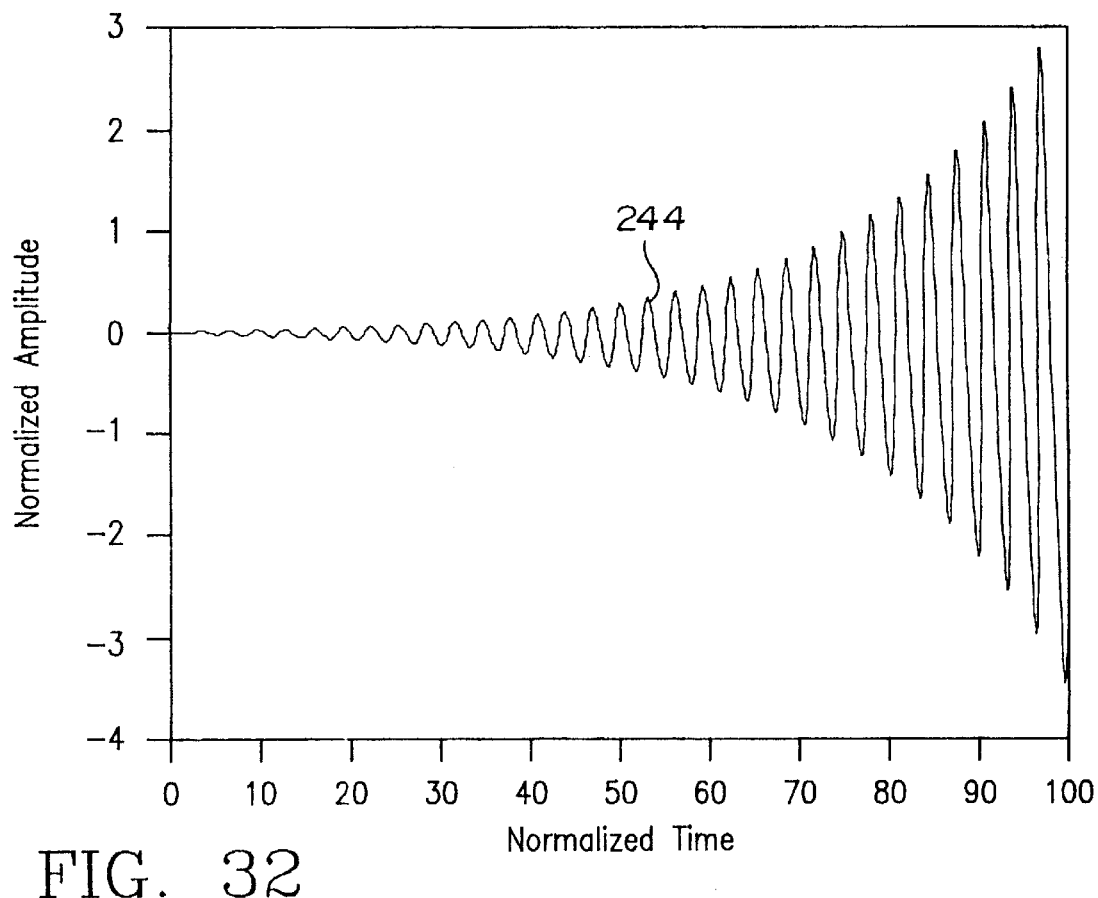
FIG. 32 illustrates the time response of Equation 11, with $\beta=4$, $\delta=0.5$, and $e=0.01$, with parametric and direct forcing.

For the n=2 instability, the effects are much more coupled, as the parametric instability is centered around the driven resonant frequency of the device. However, the parametric effects can still dominate in some circumstances. FIGS. 31 and 32 illustrate this. Curve 242 in FIG. 31 shows the response of a system with no parametric driving. The only forcing term is an external one. This system displays input typical of a standard resonator, and the amplitude grows linearly. Curve 244 in FIG. 32 shows the same amplitude driving term, but has an additional parametric driving term ten times larger than the external term. From this addition, it is seen that the response is now being dominated by the parametric forcing, for it displays the exponential growth associated with parametric excitation.

Figure 33:
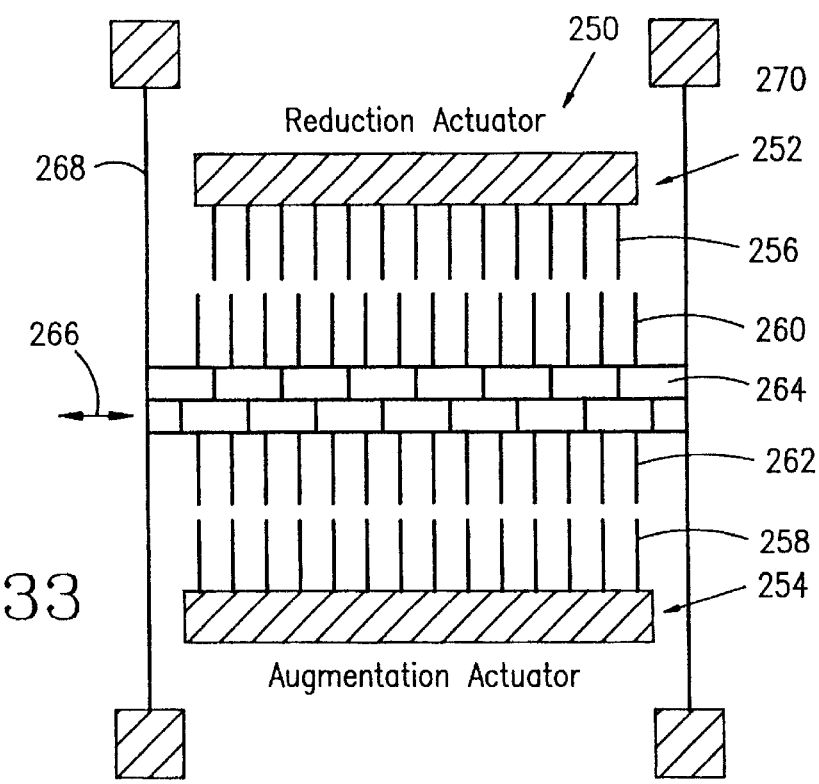
FIG. 33 illustrates reduction and augmentation actuators which are operable in accordance with the present invention.

Other novel actuator designs have been developed which display parametric resonance behaviors. These include fringing-field actuators such as actuator 250 illustrated in FIG. 33, which provides independent tuning of linear and cubic stiffness terms, and which is described in U.S. Pat. No. 5,914,553. The actuator 250 includes a reduction actuator 252 and an augmentation actuator 254 which resemble comb drive actuators, except that their stationary fingers 256 and 258 are not interdigitated with the corresponding movable fingers 260 and 262, respectively, mounted on movable beam 264. In the reduction actuator 252 configuration, when the actuator beam 264 moves to the left, the net force toward the left is increased, while in the augmentation actuator 254 configuration, when the actuator beam 264 moves to the left, the net electrostatic force is toward the right. These actuators, unlike standard comb-drive actuators, move in a direction that is perpendicular to the direction of the fingers, as shown schematically by arrow 266 in the figure. They move because of the fringing electric fields between the movable and fixed fingers.

Figure 34:
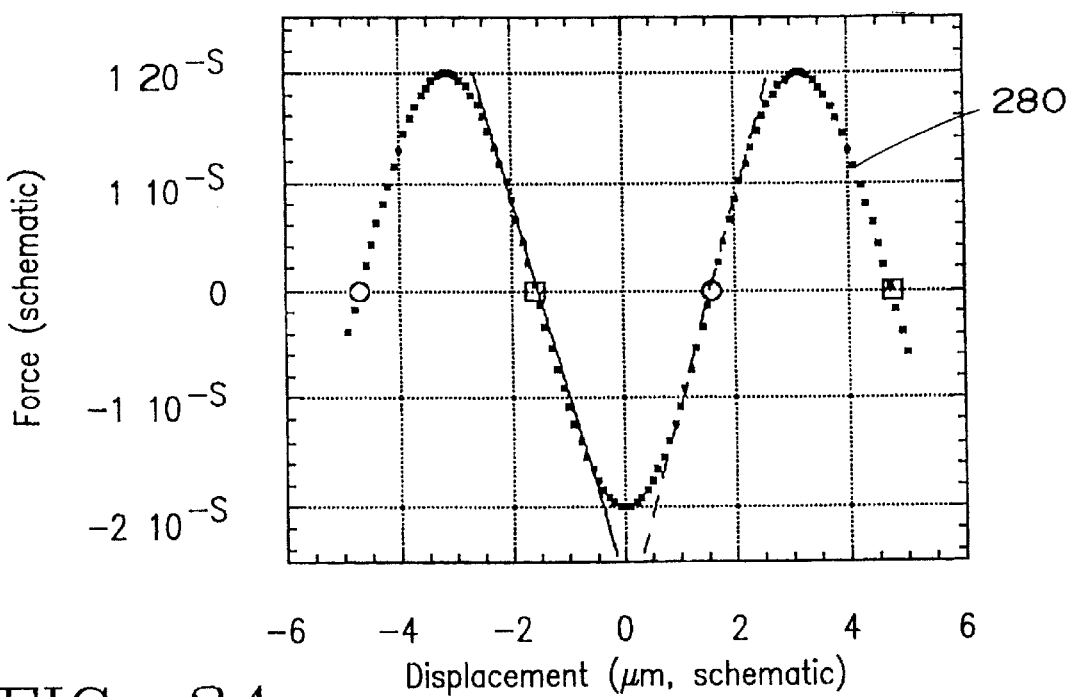
FIG. 34 is a schematic illustration of the relationship between force and displacement in the actuator of FIG. 33.

Depending on the original position of the movable fingers with respect to the fixed fingers, the electrostatic spring constant of beam support springs 268 and 270 acts negatively or positively. FIG. 34 is a graph including a curve 280 showing force vs. displacement for different regions of the force relation for reduction/augmentation actuators. The open squares represent the centers of the reduction areas. Depending on the initial configuration of these devices, the stiffness due to the electrostatic changes sign. Note that there is no force generated when the fingers are in the center, or zero displacement, position.

Examination of FIG. 34 reveals two distinct linear regions. In the region surrounding points marked by the open squares, the curve has a negative slope (augmentation), and for the region surrounding points marked by open circles (reduction), the curve has a positive slope. Thus, depending on the initial position of the actuator, the behavior of the device can be quite different.

An approximate equation of motion for each of these regions can be developed. Beginning with the standard equation of motion, and assuming that the devices have a fixed-fixed spring configuration, with mechanical stiffness which are linear with a small cubic term, we get: $m\ddot{x}+c\dot{x}+kx+hx^3=F(x, t)$., where F depends on whether a reduction or augmentation configuration is used. First, consider the augmentation alignment, where the slope of F vs. position is negative. A sinusoidal driving term is applied, although a square-rooted sinusoid can also be applied. For a sinusoidal driving term, the equation of motion becomes:

$$m\ddot{x}+c\dot{x}+kx+hx^3=-\xi x(V \sin \omega t)^2 \quad \text{(Eq. 14)}$$

and if $V^2 \sin^2 \omega t$ is represented by trigonometric substitution as $V^2(1-\cos 2\omega t)/2$, the equation becomes:

$$\ddot{x}+\frac{c}{m}\dot{x}+\frac{1}{m}\left[\left(k+\frac{V^2}{2}\xi\right)-\frac{V^2}{2}\xi\cos 2\omega t\right]x+\frac{h}{m}x^3 = 0 \quad \text{(Eq. 15)}$$

which is a parametrically forced equation of the Mathieu type. Instabilities are predicted where $\omega=\omega_0/n$, where $\omega_0^2=(1/m)(k+V^2\xi/2))$.

The reduction actuator has the same form as Equation 15, except the sign is reversed on the term proceeding x due to electrostatic forcing. Thus, the equation of motion appears as:

$$\ddot{x}+\frac{c}{m}\dot{x}+\frac{1}{m}\left[\left(k-\frac{V^2}{2}\xi\right)+\frac{V^2}{2}\xi\cos 2\omega t\right]x = 0 \quad \text{(Eq. 16)}$$

which is a parametrically forced differential equation of the Mathieu type, and responds as previously discussed. This equation also predicts instabilities at frequencies at $\omega=\omega_0/n$.

Figure 35:
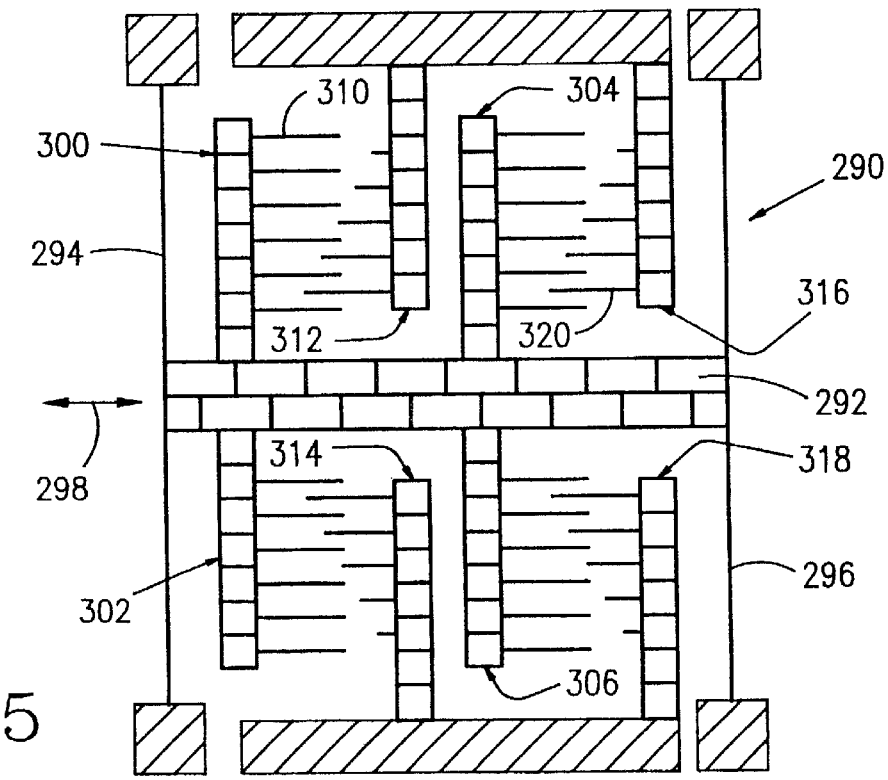
FIG. 35 is a schematic illustration of a linear force comb actuator, in which the lengths of the fixed fingers varies linearly along each set of fingers.

One additional device which shows parametric resonance is a linear-force comb actuator such as that illustrated at 290 in FIG. 35. This comb drive is very similar to a standard in-plane comb drive; however, this comb drive has fingers which vary in length. A schematic of such a device is shown in FIG. 35. As there illustrated, a movable beam 292 is mounted at its opposite ends on springs 294 and 296, which are perpendicular to the axis of beam 292. The springs are fixed at their outer ends to constrain the beam to linear motion along its axis, in the direction of arrow 298. The beam carries movable sets 300, 302, 304, and 306 of fingers 310 which oppose corresponding fixed sets 312, 314, 316, and 318 of fingers 320, mounted, for example, on a substrate. The lengths of the fixed fingers 320 vary linearly along each set.

This device behaves similarly to a standard comb drive, except that since the number of capacitive fingers which are overlapped is not constant, the net force increases with position. This creates a linear force vs. distance relationship. The equation of motion can be developed in the following way. First consider the standard one degree-of-freedom mechanical model:

$$m\ddot{x}+c\dot{x}+kx=F(t, x) \quad \text{(Eq. 17)}$$

For a linear-force comb drive, $F(t, x)=\Im^*(sx+q)$, where $\Im$ is the maximum amplitude of the applied force, s is the slope of the force vs. displacement curve, s is the slope of the voltage vs. displacement relation, and q is the equilibrium position of the actuator. The final equation of motion for the system when forced with a square rooted sinusoid is:

$$m\ddot{x}+c\dot{x}+(k+\Im s+s\Im \cos \omega t)x=\Im q+q\Im \cos \omega t \quad \text{(Eq. 18)}$$

which is very similar to the parallel plate actuator equation shown in Equation 10. The instability regions are predicted from theory to be at $\omega=2\omega_0/n$. The first instability region displays parametric actuation as explained with respect to the parallel plate actuator. As in the parallel plate actuator, in the second instability region the non-parametric driving term is at the same frequency as the region of parametric instability. So if $\Im q$ is large, the term on the right-hand side of the equation dominates and the response is not parametric in nature. However, if $\Im q$ is very small, then the parametric response dominates the behavior. Numerical studies have shown that if s>5q (the parametric term is >5 times larger than the external driving term), then the parametric terms dominate the response. Thus, the ideal configuration would be one in which the force generated in the starting position is very small, and as the actuator moves in either direction, the force increases linearly.

Microelectromechanical actuator configurations such as those described above, as well as other configurations which may be operated parametrically to achieve resonance at frequencies other than the natural frequency of the device, have a wide range of uses. The nonlinear or quasi-linear effect produced by the sharp discontinuity between stable and unstable operation due to changes in the properties of the device can be used in a wide variety of sensing applications. For example, very small changes in temperature, pressure, force, mass, damping, or the like can cause a parametric actuator to cross the threshold between stable and unstable operation. This shift produces a large change in the output of the actuator at a characteristic frequency that is easy to detect, as has been described.

One example of the use of such a highly sensitive device is in the measurement of small changes in mass, such as the changes that might occur as a result of chemical reactions or as the result of the capture of a molecule. A parallel-plate capacitive actuator, such as that illustrated in FIG. 29, can be used as a parametric mass sensor. Such a device exhibits parametric resonance when n=1, as described above, with the slope of the n=1 transition curve being determined by the following equation.

$$\beta \cong 1 \pm \delta \quad \text{(Eq. 19)}$$

The equation describing the transition curves for n=1 is, to a first approximation:

$$\omega^2 = \frac{4k}{m} - \frac{4\varepsilon_0 A A_{DC}}{md_0^3}, \text{ and } \omega^2 = \frac{4k}{m} \quad \text{(Eq. 20)}$$

where n is an integer >=1, k is the linear stiffness of the system, m is the mass, $\epsilon_0$ is the permittivity of the fluid in which the device is operated in, d is the gap between fixed and moving actuator plates, to ω=driving frequency, A is the area of the capacitive plate, and $A_{DC}$ is the applied signal magnitude. When the system is subject to a change in mass, the equations for the transition curves change due to dm. A small change in mass, dm, shifts the transition curves for n=1. And since the transition curve on the left-hand edge of the instability region is selective to 0.001 Hz (FIG. 26), very small changes in mass can be resolved. To investigate just how small a mass can be resolved in a best case scenario, the following equation, which relates a change in mass to a resolvable shift in the transition curve equation, may be used:

$$dm = \left|\left(4k - \frac{4\varepsilon_0 A A_{DC}}{d_0^3} \frac{1}{\omega^3}\right)\right| d\omega \qquad \text{(Eq. 21)}$$

Thus, extremely small changes in mass can be resolved, as dω can be ~0.001 Hz. The stiffer the device is, and the higher the resonant frequency, the higher the resolution in mass that can be achieved. Since the boundaries are extremely sharp, there is a very high degree of discrimination for small mass changes. Thus, if the device sees a mass change anywhere on its surface, it changes the boundary between stability and instability.

Thus, there has been described a microelectromechanical parametrically forced torsional oscillator which has regions of instability and regions of stability which are separated by sharply defined transition regions. The behavior of the device can be controlled by damping the device and the width of the instability bands can be changed by adjusting the amplitude of the input signal for a wide variety of uses. Although the invention has been described in terms of preferred embodiments, it will be apparent that variations and modifications can be made without departing from the true spirit and scope thereof, as set forth in the following claims:

What is claimed is:

1. A parametric resonance oscillator comprising:
   a parallel plate micromechanical actuator mounted for in-plane motion with respect to a substrate and incorporating a linear force comb drive actuator, said structure having a natural resonant frequency of oscillation;
   an electrode on said structure; and
   a drive circuit connected to said electrode to supply a drive signal at a frequency selected to produce parametric oscillation of said structure.

2. The oscillator of claim 1, wherein said drive signal has a frequency greater than said natural resonant frequency.

3. The oscillator of claim 2, further including an electrode on said substrate, wherein said electrode on said substrate is capacitively coupled to said electrode on said structure.

4. The oscillator of claim 3, wherein said drive circuit is connected between said electrode on said structure and said electrode on said substrate.

5. The oscillator of claim 4, further including a frequency controller for said drive circuit to select the frequency of said drive signal.

6. The oscillator of claim 5, further including a sensor for detecting variations in the capacitive coupling of said electrodes.

7. The oscillator of claim 1, wherein said drive circuit is variable to supply drive signals at selected frequencies to produce a sharp transition between stable and unstable oscillation of said structure.

8. A microelectromechanical device, comprising:
   a substrate;
   a parallel plate actuator incorporating a linear force comb drive actuator, said actuator having selected structural parameters and mounted for in-plane motion at a natural resonant frequency with respect to said substrate;
   at least first and second parallel, capacitively coupled plates on said substrate and on said actuator, respectively; and
   a drive signal source connected between said first and second plates, said drive signal having a frequency and amplitude selected to cause said actuator to oscillate with respect to said substrate at a frequency other than said natural resonant frequency, variations in said structural parameters or in the frequency or amplitude of said drive signal causing said actuator to shift between stable and unstable oscillation.

9. The device of claim 8, wherein a selected structural parameter includes the mass of said actuator.

10. The device of claim 8, wherein a selected structural parameter includes a force applied to said actuator.

11. The device of claim 8, wherein a selected structural parameter includes ambient pressure or temperature.

12. The device of claim 8, wherein a selected structural parameter includes externally applied damping of said actuator.

13. A micromechanical sensor, comprising:
   an actuator mounted for motion with respect to a substrate, said actuator having a mass which produces in said actuator a natural resonant frequency of motion;
   drive electrodes on said actuator and on said substrate; and
   a drive circuit connected to said drive electrodes, said drive circuit including a signal generator supplying a drive signal to said electrodes having an amplitude and frequency selected to produce parametric oscillation of said actuator, and wherein a change in the mass of said actuator causes said actuator to shift between stable and unstable regions of oscillation for detection of said change.

14. The sensor of claim 13, wherein said actuator has a sharp threshold between said stable and unstable regions, whereby an extremely small change in said mass causes said shift between said stable and unstable regions.

15. The sensor of claim 14, wherein said drive electrodes are capacitively coupled, and further including a detector connected to said electrodes for measuring the motion of said actuator with respect to said substrate.

16. The sensor of claim 15, wherein said detector measures said motion by detecting variations in said capacitive coupling at said natural resonant frequency.

17. The sensor of claim 13, wherein said signal generator is variable to shift said actuator between stable and unstable regions of operation.

18. The sensor of claim 17, wherein said unstable region of operation for said actuator is parametric resonant oscillation at a frequency greater than said natural resonant frequency.

19. A method of detecting changes in a measured parameter, comprising:
   mounting a microelectromechanical actuator for oscillating motion with respect to a substrate at a natural resonant frequency;
   generating a drive signal having a frequency and amplitude selected to cause parametric resonant oscillation of said actuator at a frequency greater than said natural resonant frequency;

applying said drive signal across fixed and stationary capacitively coupled electrodes on said actuator and said substrate, respectively, to cause said actuator to oscillate at said parametric resonant frequency;

measuring the amplitude of the oscillation of said actuator; and detecting changes in the amplitude of said oscillation in response to changes in a measured parameter.

20. The method of claim 19, wherein mounting said actuator includes fabricating a microelectromechanical actuator on said substrate, said actuator having structural characteristics producing a sharp threshold between a stable region of operation having a low amplitude oscillation and an unstable region having a relatively high amplitude parametric resonant oscillation.

21. The method of claim 19, wherein mounting said actuator for oscillating motion includes providing a fringing field actuator having at least one of a reduction actuator and an augmentation actuator.

22. The method of claim 19, wherein mounting said actuator for oscillating motion includes providing a linear-force comb actuator.

23. A sensor, comprising:

a micromechanical actuator mounted for oscillating motion with respect to a substrate at a natural resonant frequency of motion that is dependent on a structural characteristic of said actuator;

capacitively coupled drive electrodes on said actuator and on said substrate;

a drive circuit connected between electrodes on said actuator and electrodes on said substrate;

a signal generator supplying a drive signal across said actuator and substrate electrodes, said drive signal having an amplitude and frequency selected to cause parametric resonant oscillation of said actuator with respect to said substrate at a frequency greater than said natural resonant frequency, whereby said actuator has a sharp threshold between stable and unstable oscillation; and means for measuring the amplitude of oscillation of said actuator to detect changes in the amplitude of oscillation caused by a change in said structural characteristic of said actuator.

24. The sensor of claim 23, wherein said actuator is a parallel plate actuator mounted for in-plane motion with respect to said substrate.

25. The sensor of claim 24, wherein said actuator is a comb drive actuator.

26. The sensor of claim 24, wherein said actuator is a fringing field actuator.

27. The sensor of claim 26, further including a reduction actuator.

28. The sensor of claim 26, further including an augmentation actuator.

29. The sensor of claim 26, further including reduction and augmentation actuators.

30. The sensor of claim 24, wherein said actuator is a linear-force comb drive actuator.

31. A parametric resonance oscillator comprising:

an actuator spring-mounted for motion with respect to a substrate at a natural resonant frequency, said actuator having at least one selected structural parameter determinative of said natural resonant frequency;

at least first and second parallel, capacitively coupled plates on said substrate and said actuator, respectively;

drive circuitry connected to said actuators and energizable to supply to said plates a drive signal having a frequency and amplitude selected to cause said actuators to oscillate with respect to said substrate at a stable parametric frequency other than said natural resonant frequency, variations in said structural parameter or in the frequency or amplitude of said drive signal causing said actuator to shift between said stable and an unstable oscillation; and means for detecting a shift between stable and unstable oscillation to detect changes in said structural parameter.

32. The oscillator of claim 31, further including means for adjusting said structural parameter.

33. The oscillator of claim 32, wherein said means for adjusting said structural parameter includes a means for varying the mechanical stiffness of said spring-mounted actuator.

34. The oscillator of claim 31, wherein said structural parameter is the mass of said actuator.

* * * * *